US008261172B1

(12) United States Patent
Yu et al.

(10) Patent No.: US 8,261,172 B1
(45) Date of Patent: *Sep. 4, 2012

(54) VITERBI DECODER METHOD AND APPARATUS WITH RI DETECTOR IN SERVO CHANNEL

(75) Inventors: Zaihe Yu, Santa Clara, CA (US); Michael Madden, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/282,910

(22) Filed: Oct. 27, 2011

Related U.S. Application Data

(63) Continuation of application No. 12/015,913, filed on Jan. 17, 2008, now Pat. No. 8,051,365.

(60) Provisional application No. 60/885,297, filed on Jan. 17, 2007.

(51) Int. Cl.
*H03M 13/03* (2006.01)

(52) U.S. Cl. ........ 714/795; 714/700; 714/746; 714/751; 714/752; 714/792; 714/794; 714/796; 360/77.02; 360/1; 360/29; 360/26; 360/39

(58) Field of Classification Search ................ None
See application file for complete search history.

(56) References Cited

U.S. PATENT DOCUMENTS

| 7,082,005 | B2* | 7/2006 | Annampedu et al. ........... 360/51 |
| 7,349,167 | B2* | 3/2008 | Erden et al. ..................... 360/29 |
| 7,362,536 | B1* | 4/2008 | Liu et al. ..................... 360/77.02 |
| 2003/0099052 | A1* | 5/2003 | Annampedu et al. ........... 360/39 |
| 2005/0264922 | A1* | 12/2005 | Erden et al. ................. 360/78.04 |

* cited by examiner

*Primary Examiner* — John Trimmings

(57) ABSTRACT

Apparatus and methods are disclosed for decoding data stored on a data storage medium. A disclosed decoding method and decoder include a radial incoherence (RI) detector that increases the probability of detecting RI and improves the decoding performance in terms of the bit error rate of the decoded signal. RI is detected by comparing an input signal to the decoder against a RI threshold value and generating a RI-type signal. The RI detector may include a filter for filtering out noise and error in the RI-type signal, an adaptive threshold unit that adjusts the RI threshold value based upon the RI-type signal, a transition-based threshold unit that adjusts the RI threshold value based upon each transition in the input signal, or a path-based threshold unit that adjusts the RI threshold value based upon a best surviving path corresponding to the input signal, in combination or alone.

20 Claims, 23 Drawing Sheets

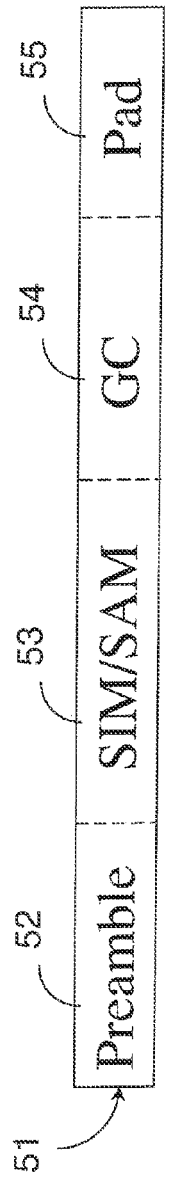
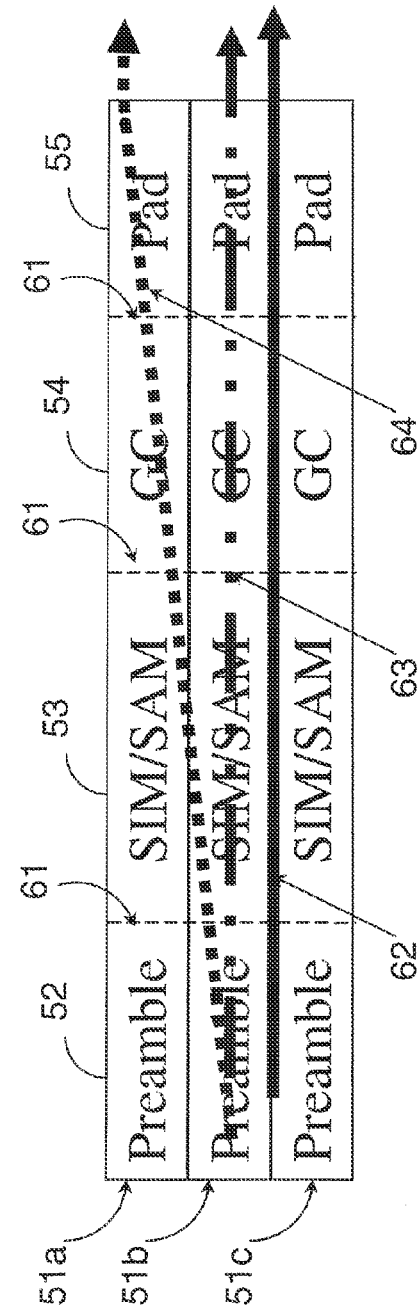

VITERBI DECODER METHOD AND APPARATUS WITH RI DETECTOR IN SERVO CHANNEL

CROSS REFERENCE TO RELATED APPLICATION

This application is a continuation of U.S. patent application Ser. No. 12/015,913, filed Jan. 17, 2008, which claims the benefit of the filing date of U.S. Provisional Application No. 60/885,297 filed Jan. 17, 2007 (now expired), all of which are incorporated by reference herein in their entireties.

TECHNICAL FIELD

The present disclosure generally relates to the retrieval of data from data storage mediums such as magnetic disk drives. More particularly, the present disclosure relates to a system that detects the radial incoherence generated by the movement of a read/write head over the surface of a storage medium and decodes the data stored on a data storage medium.

BACKGROUND

A modern computing system typically comprises a central processing unit, a memory unit, and supporting hardware necessary to communicate both within the system and to the outside world. Within the computing system, communication buses may exist to transmit information and instructions between the processing unit and the memory unit. To communicate with the outside world, input and output ("I/O") devices may be used. Common examples of input devices include the keyboard and mouse. Output devices include printers and display devices such as a monitor. In addition, storage devices such as hard disk drives, floppy disk drives, and optical disk drives may serve as both input and output devices.

In conventional hard disk drives, information in the form of analog or digital data is recorded on concentric tracks on a magnetic disk. The disk is spun at a very high speed while a read/write head moves radially over the surface of the disk in order to read information from or write information to the tracks. Information which is read out from a disk may be supplied to a device known as a Viterbi decoder to generate a reproduction of an original data signal recorded on the disk.

One type of information commonly written to and read from the tracks is servo information. Servo information may comprise control information such as address and position information to allow proper alignment of the read/write head with respect to the tracks, as well as other track identification information. Servo information is often written on a portion of the disk platter known as a servo wedge. Within a servo wedge, the servo information is broken up into multiple servo fields, each typically containing a different type of servo information. While reading such information or performing a seek operation to pinpoint a specific track, a read/write head may radially traverse multiple tracks. When the servo wedges are not properly aligned along the radial direction, "radial incoherence" (RI) may result. RI is the timing offset that occurs when a head moves between radially adjacent tracks in which the servo wedges are not properly aligned. The waveform signal read by the head may undergo a phase shift due to the RI, called the RI phase, which leads to errors in decoding the recorded servo information.

Typically, RI is detected by a RI detector with a fixed or symmetric RI detection threshold in a servo channel. However, a RI detection threshold that is set too high may fail to detect RI when it exists. Conversely, a RI detection threshold that is set too low may detect false positives when no RI exists. In addition, noise or other errors can corrupt a sequence of RI data.

Thus, there is a need for an improved system for RI detection that increases the probability of detecting RI and reduces the bit error rate (BER) of a decoded signal read from a disk.

SUMMARY

Disclosed is a system for decoding data stored on a data storage medium. The system comprises a first input terminal receiving a data stream read from the data storage medium. The data stream comprises a plurality of data transitions. The system further comprises an input unit identifying portions of the data stream as possible transitions and selecting a subset of the possible transitions in response to a selection input. A second input unit generates estimated phases of the possible transitions and selects one of the estimated phases. A phase buffer stores a plurality of the selected estimated phases. An adder generates a first sum by adding the plurality of the selected estimated phases. The system also comprises a decision unit using the first sum to generate a flag indicating a type of radial incoherence associated with the data stream and a filter generating and supplying the selection input to the first input unit.

Further disclosed is a system for decoding data stored on a data storage medium. The system comprises an input terminal receiving a data stream read from the data storage medium, the data stream comprising a plurality of data transitions. The system further comprises an input unit identifying portions of the data stream as possible transitions and selecting a subset of the possible transitions in response to a selection input. A path-based input unit generates a first sum and a path-based threshold unit generates a second sum. The system also comprises a decision unit using the first and second sums to generate a flag indicating a type of radial incoherence associated with the data stream and a filter generating and supplying the selection input to the first input unit.

Also disclosed is a method for decoding data stored on a data storage medium. The method comprises receiving a data stream read from the data storage medium, the data stream comprising a plurality of data transitions. The method further comprises identifying portions of the data stream as possible transitions and selecting a subset of the possible transitions in response to a selection input. The method also comprises estimating phases of the possible transitions and selecting one of the estimated phases. The method further comprises generating a first sum by adding a plurality of the selected estimated phases. The method also comprises generating a plurality of flags indicating types of radial incoherence associated with the data stream and generating the selection input from the plurality of flags.

Also disclosed is a method for decoding data stored on a data storage medium. The method comprises receiving a data stream read from the data storage medium, the data stream comprising a plurality of data transitions. The method further comprises identifying portions of the data stream as possible transitions and selecting a subset of the possible transitions in response to a selection input. The method also comprises estimating phases of the possible transitions and generating a first sum from the plurality of estimated phases. The method further comprises storing a plurality of path-based threshold values and generating a second sum from the plurality of path-based threshold values. The method also comprises generating a plurality of flags indicating types of radial incoherence associated with the data stream and generating the selection input from the plurality of flags.

BRIEF DESCRIPTION OF THE DRAWINGS

The accompanying drawings, which are incorporated in and constitute a part of this specification, show certain aspects of implementations consistent with the present invention and, together with the description, help explain some of the principles associated with the invention. In the drawings.

FIG. 3A depicts a servo information format;

FIG. 3B depicts the trajectory of a read/write head across aligned servo wedges on radially adjacent tracks;

DETAILED DESCRIPTION

Reference will now be made in detail to the invention, examples of which are illustrated in the accompanying drawings. The implementations set forth in the following description do not represent all the implementations consistent with the claimed invention. Instead, they are merely some examples consistent with the present invention. Wherever possible, the same reference numbers will be used throughout the drawings to refer to the same or like parts.

Figure 1:
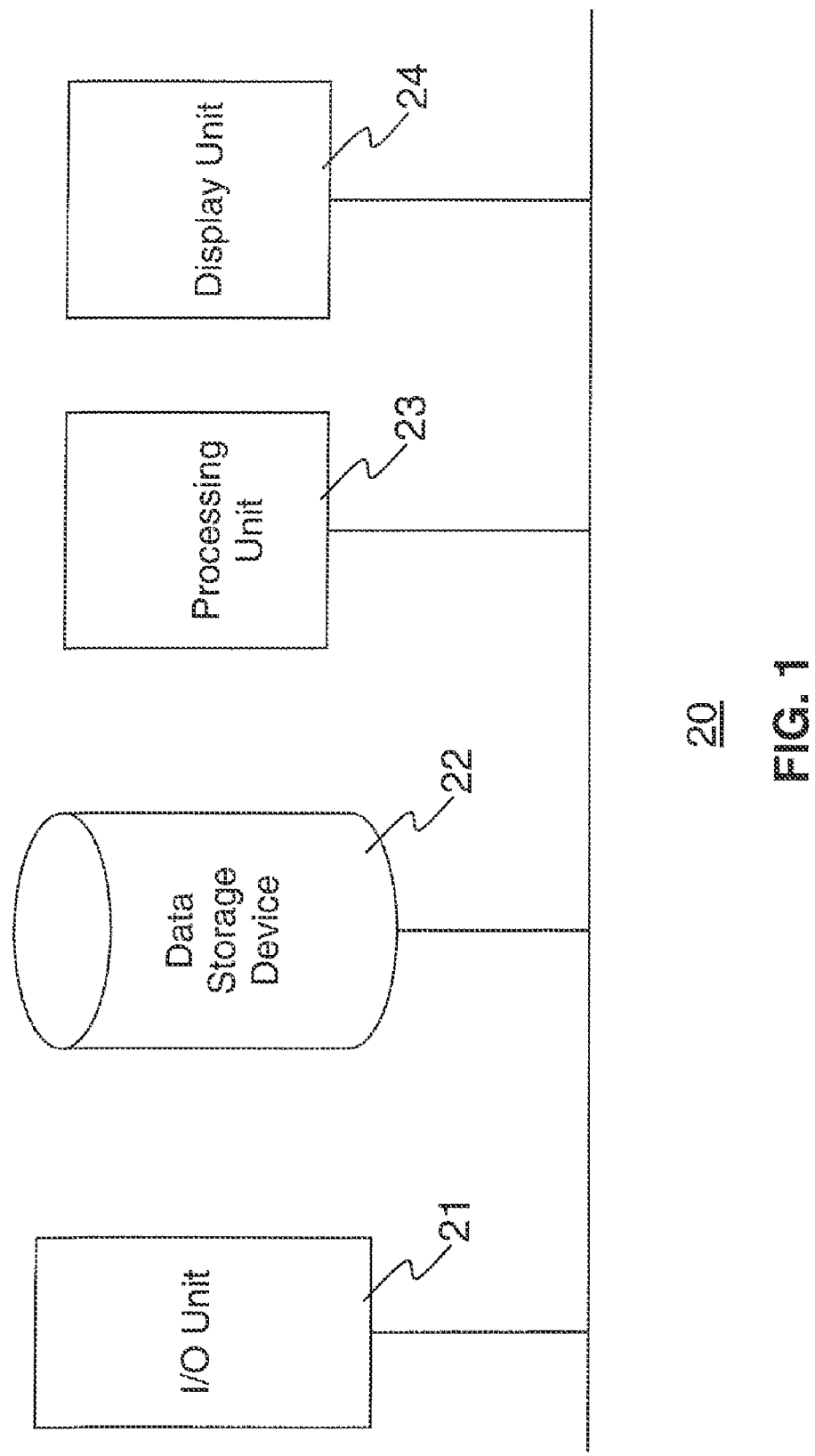
FIG. 1 is a block diagram of an exemplary system environment consistent with certain aspects related to the present invention.

FIG. 1 is a block diagram of an exemplary computer system environment consistent with the present invention. Referring to FIG. 1, a system 20 includes an I/O unit 21, a data storage device 22, a processing unit 23, and a display unit 24. I/O unit 21 interfaces with peripherals such as keyboards, cursor tracking devices, and printers to receive and transmit information to and from the other units. Display unit 24 generates and provides viewable images as a result of information received via I/O unit 21. Data storage device 22 may comprise hard disk drives, floppy disk drives, optical disk drives and/or other similar storage media. Data storage device 22 communicates with and is accessed by processing unit 23, which is the main or central processing unit for the system. Processing unit 23 communicates with data storage device 22, I/O unit 21, and display unit 24 as well as with an internal memory unit consisting of random access memory (RAM) and read-only memory (ROM) to perform standard processing functions on data received by and sent between the units. Processing unit 23 also accesses the data storage device 22, retrieving data which it decodes to reveal servo and other information, while detecting the presence of RI. Alternatively, a disk controller unit (not shown) coupled to the data storage device 22 and processing unit 23 accesses the data storage device 22, retrieves data, decodes the data while detecting the presence of RI, and then transmits the decoded data to the processing unit 23 for further processing.

Figure 2:
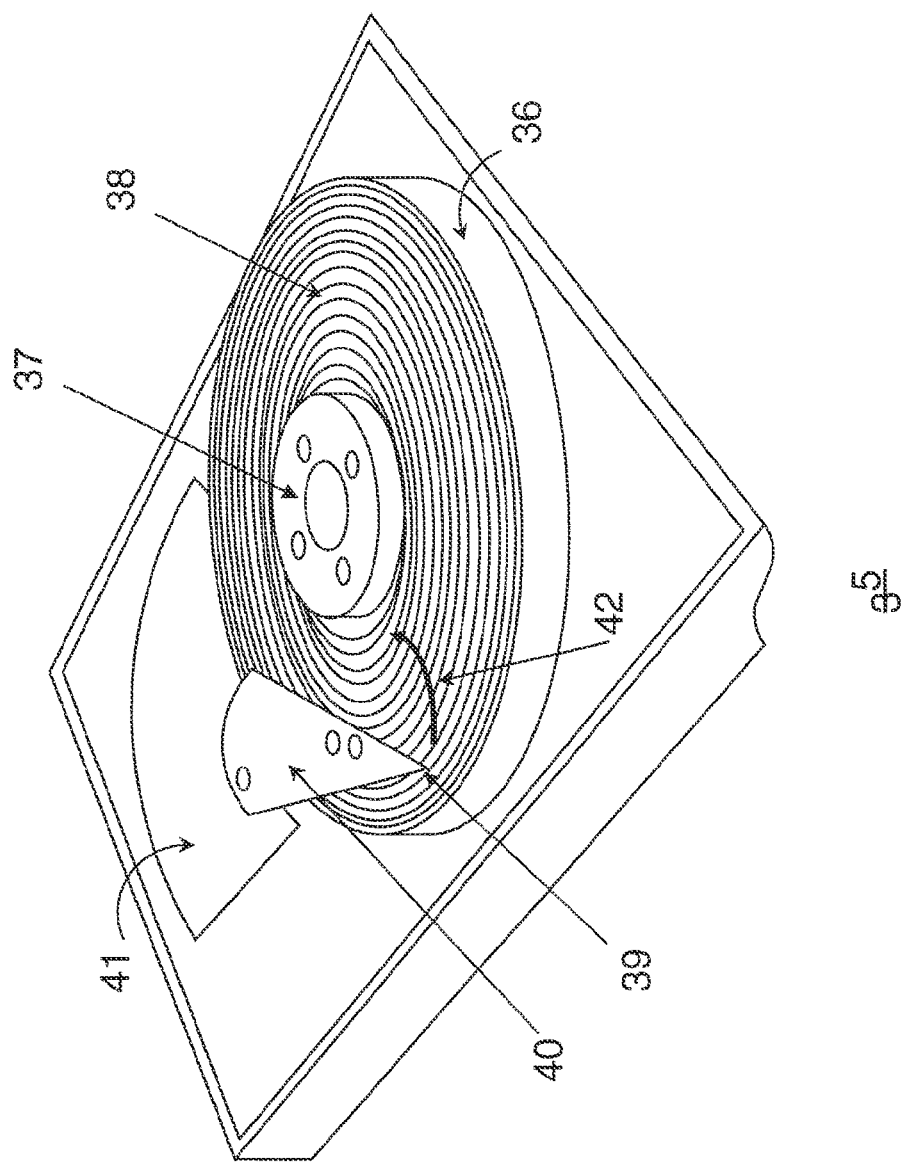
FIG. 2 is a perspective view of a typical disk drive.

FIG. 2 shows in greater detail a perspective view of a typical disk drive 35 within data storage device 22. Disk drive 35 includes a circular disk 36 which may consist of either a single platter or a plurality of individual platters, mounted on a spindle 37. Spindle 37 is attached to a spindle motor (not shown), which spins disk 36. The platters of disk 36 are formatted to contain concentric tracks 38 within which information, such as servo information, may be recorded. Information may be recorded within tracks on either or both sides of the platters of disk 36. This information may be recorded onto the disk in a variety of ways, for instance, in di-bit, tri-bit, or quad-bit encoding. Manchester code may also be used to encode the information. When encoding the information via di-bit code or Manchester Code, one user bit is encoded as four bits. For example, in di-bit code, a user bit 1 is encoded as 1100, and a user bit 0 is encoded as 0000. In Manchester Code, a user bit 1 is encoded as 1100, and a user bit 0 is encoded as 0011.

Disk drive 35 also includes an actuator 41, which moves and controls an actuator arm 40 supporting a read/write head 39. In response to control by actuator 41 and actuator arm 40, read/write head 39 moves in a substantially radial direction across the concentric tracks 38, as shown by arrow 42.

FIG. 3A depicts an exemplary servo information format 50 recorded on a servo wedge on track 51. It will be understood by those skilled in the art that track 51 has been magnified to many times its actual size such that it appears to be a straight line, although it is actually part of a circular track. The servo wedge on track 51 is divided into servo fields 52-55, the fields containing different types of servo information. Servo field 52 may contain a preamble field, which generally precedes servo information and includes information to identify where servo information begins and to synchronize timing circuits. A servo index mark (SIM) and a servo address mark (SAM) field, contained in servo field 53, typically follow the preamble field and also contain identifying and synchronizing information. Servo field 54 may contain a Gray Code (GC) field which is generally encoded in Manchester Code and which includes information such as a track and wedge identification number (track-ID) for positioning read/write head 39 over a track and a wedge. The application of GC makes two radially adjacent track-IDs only differ in one di-bit. Because of the equivalent discrete-time response of the recording medium and the underlying signal path, the GC in the readback signal is generally in the form of convolution code. Servo field 55 may contain a pad field which separates the GC from servo burst data (not shown). Although servo format 50 depicts only four servo fields 52-55 with preamble, SIM and SAM, GC, and pad information, servo fields containing other types of information not described here may also be used.

When playing back the servo data, it is expected that read/write head 39 moves along the center of a track 51 such that the interference from adjacent tracks will be very small and thus can be ignored. In reality, however, read/write head 39 may not always move along the center of a track, resulting in influence from adjacent tracks that cannot be ignored. In considering the influence of adjacent tracks, a linear model is frequently used. The signal at the output of read/write head 39 may be modeled as:

$$z(t)=(1-\alpha)*x(t)+\alpha*y(t) \quad (1)$$

where z(t) is the signal at the output of read/write head 39, x(t) is the on-track (i.e., the target track) signal, y(t) is the off-track (i.e., one of the adjacent tracks) signal, and $0 \leq \alpha \leq 1$ is the position of read/write head 39. If $\alpha=0$, read/write head 39 is at the center of on-track. If $\alpha=0.5$, read/write head 39 is at the middle of the two tracks, on-track and off-track. If $\alpha=1$, read/write head 39 is at the center of off-track.

The signal read by read/write head 39 is in the form of a continuous-time waveform. This signal will usually pass through an analog front end (AFE), an analog to digital converter (ADC), and a digital equalizer. The signal at the output of the digital equalizer, which is the input signal to the Viterbi decoder, may be modeled as:

$$z'(k)=(1-\alpha)*x'(k)+\alpha*y'(k) \quad (2)$$

where z'(k) is the signal at the output of the digital equalizer and the input signal to the Viterbi decoder and x'(k) and y'(k) are the samples at the equalizer output for signals x(t) and y(t), respectively, at the k-th sampling instant, where k is an integer. From Equation (2), it is evident that z'(k) will be different than the desired signal x'(k) as long as y'(k)≠x'(k) and $\alpha \neq 0$. This effect is called RI as it is due to the radial offset of the read/write head 39 from the center of the on-track.

An exemplary servo information format 50, servo field 54 contains a track-ID in GC and the GC of two radially adjacent servo fields 54 in a same servo wedge only differ by one di-bit (i.e., four coded bits), and each of the servo fields 52, 53, and 55 on a same servo wedge are the same. Thus, the waveforms of the servo fields on a servo wedge across radially adjacent tracks will have the same shape. The waveforms will differ only in initial phase. Accordingly, y(t), the off-track signal, can be expressed as:

$$y(t)=x(t-\tau) \quad (3)$$

where $\tau$ is a real value and represents the phase difference. Negative RI occurs where $\tau<0$ and $\alpha \neq 0$. Positive RI occurs where $\tau>0$ and $\alpha \neq 0$.

FIG. 3B depicts a servo wedge on radially adjacent tracks 51a-c, with servo fields 52-55 aligned along boundaries 61. Again, It will be understood by those skilled in the art that tracks 51a-c have been magnified to many times their actual size such that they appear to be straight lines, although they are actually part of circular tracks. In the aligned system, boundaries 61 of the servo fields in a servo wedge on a track are aligned with the boundaries of the servo fields in the servo wedge on adjacent tracks. In an overhead, magnified view of a disk with aligned servo wedge fields, the servo wedge fields may appear like spokes in a wheel, radiating out from the center of the disk.

FIG. 3B shows several possible trajectories 62-64 representing the relative movement of read/write head 39 (not shown). The position of read/write head 39 relative to adjacent tracks affects the signal that is read by the read/write head. Trajectory 63 represents the relative movement of read/write head 39 along the center of track 51b, where track 51b is the on-track. Because read/write head 39 is moving directly along the center of the track, the head picks up the strongest signal from track 51b. Read/write head 39 is picking up a strong on-track signal and any signals the head may sense from adjacent tracks (i.e., off-track signals) are weak. RI does not exist along path 63 since the read/write head picks up a strong signal from track 51b and negligible signal from adjacent tracks. Also, the servo fields in adjacent tracks of the servo wedge are aligned and thus, the signals from the adjacent tracks will all be in the same phase. When the signals are all in the same phase, $\tau=0$, there is no destructive interference, and the linear combination of the waveform signals from all the tracks which read/write head 39 may sense will produce no RI.

Trajectory 62 represents the relative movement of read/write head 39 directly between tracks 51b and 51c. Because of the read/write head's position relative to tracks 51b and 51c, it senses a signal from both tracks. Though the signal that read/write head 39 picks up combines the signals from track 51b and 51c, RI does not exist because the servo fields in the servo wedge are aligned and there is no phase shift between the signals picked up from the tracks.

Trajectory 64 represents the relative movement of read/write head 39 including radial movement across tracks from track 51b to 51a. As read/write head 39 moves between tracks 51b and 51a, the signal from track 51b grows weaker as the head moves away from the center of the track and the signal from track 51a grows stronger as the head moves toward the center of track 51a. However, RI does not exist because the servo fields are aligned, thus there is no phase shift between signals from the two radially adjacent tracks. In FIG. 3B, no RI exists because z'(k)=x'(k). This requires that $\alpha=0$, as shown in trajectory 63, or that y(t)=x(t–$\tau$) and $\tau=0$, as shown in trajectories 62-64.

Figure 3C:
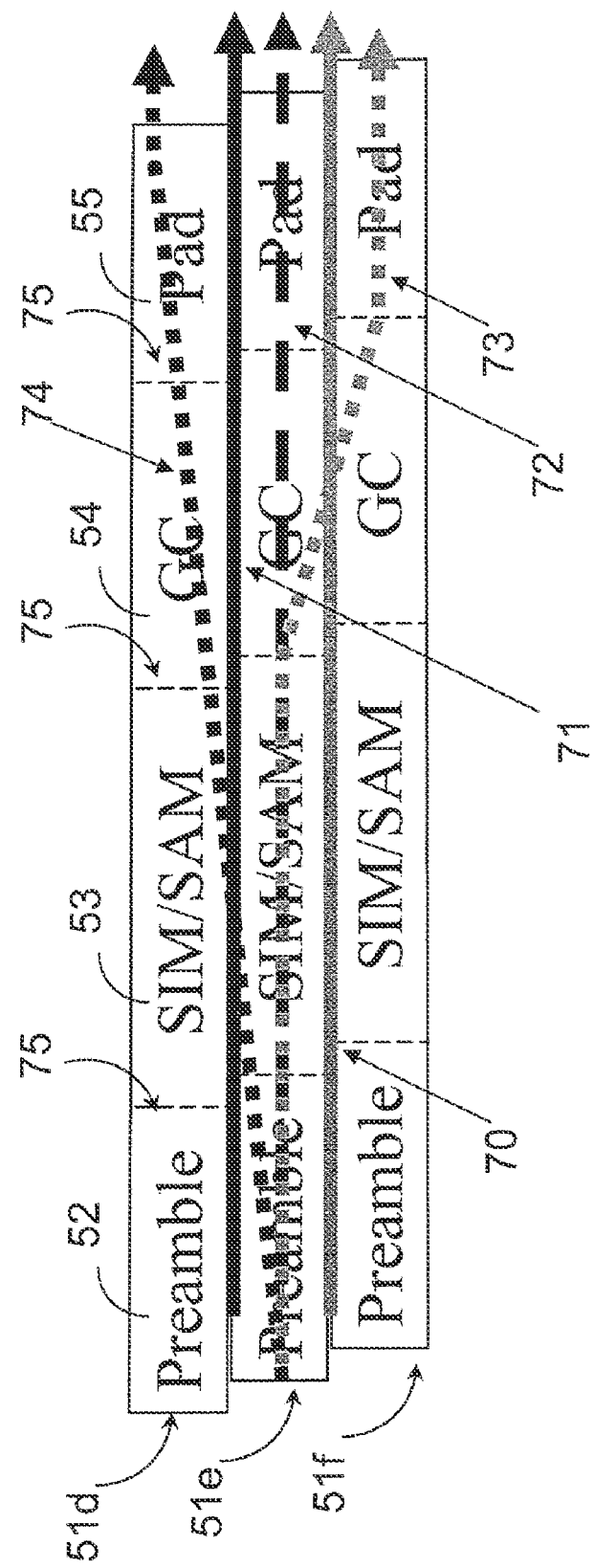
FIG. 3C depicts the trajectory of a read/write head across non-aligned servo wedges on radially adjacent tracks.

FIG. 3C depicts a servo wedge on tracks 51d-f with non-aligned servo fields 52-55. It will be understood by those skilled in the art that tracks 51d-f have been magnified to many times their actual size such that they appear to be straight lines, although they are actually part of circular tracks. Servo fields 52-55 are non-aligned along boundary 75. Boundary 75 between the servo fields shifts position along the polar axis from track 51d to 51e and from track 51e to 51f.

The relative movement of read/write head 39 is shown along different trajectories 70-74. Trajectory 72 represents the relative movement of read/write head 39 along the center of track 51e, where track 51e is the on-track. Because the read/write head is moving directly along the center of the track, the head picks up the strongest signal from track 51e. Any signals the head may sense from adjacent tracks 51d and 51f (i.e., off-track signals) are weak. RI does not exist along trajectory 72 since read/write head 39 picks up a strong signal from track 51e and negligible signals from adjacent tracks. In trajectory 72, z'(k)=x'(k) because $\alpha=0$.

Trajectory 70 represents the relative movement of read/write head 39 directly between tracks 51e and 51f. Because of the read/write head's position relative to tracks 51e and 51f, it senses a signal from both tracks. Relative to the position of the servo fields on track 51e, the servo fields on track 51f are farther along the polar axis in the direction of the read/write head's relative movement. Accordingly, read/write head 39 senses a signal from track 51f with a positive phase shift relative to that of the signal it senses from track 51e. This phase shift between the two signals causes destructive interference and the combined signal picked up by read/write head 39 will have positive RI. Positive RI occurs when read/write head 39 is in the middle of two radially adjacent servo fields of a servo wedge on radially adjacent tracks. When this occurs $\alpha=0.5$. Both the on-track and off-track signals have the same shape, but the off-track signal is delayed by one coded bit cycle with respect to the on-track signal. The off-track signal can be expressed as:

$$y(t)=x(t-T) \quad (4)$$

where T is the coded bit cycle.

Trajectory 73 represents the relative movement of read/write head 39 first along the center of track 51e and then in a radial direction across tracks from track 51e to 51f. While read/write head 39 moves along the center of track 51e, the signal picked up by read/write head 39 is the on-track signal and has no RI. As read/write head 39 moves between the two tracks 51e and 51f, the signal from track 51e grows weaker as the head moves away from the center of the track and the signal from track 51f (i.e., off-track signal) grows stronger as the head moves toward the center of track 51f. Relative to the position of the servo fields on track 51e, the servo fields on track 51f are farther along the polar axis in the direction of the read/write head's relative movement. Accordingly, read/write head 39 senses a signal from track 51f with a positive phase shift relative to that of the signal it senses from track 51e. This phase shift between the two signals causes destructive interference and the combined signal picked up by read/write head 39 as it moves radially across the tracks will have positive radial incoherence.

Trajectory 71 represents the relative movement of read/write head 39 moving directly between tracks 51e and 51d. Because of the read/write head's position relative to tracks 51e and 51d, it senses a signal from both tracks. Relative to the position of the servo fields on track 51e, the servo fields on track 51f are not as far along the polar axis in the direction of the read/write head's relative movement. Accordingly, read/write head 39 senses a signal from track 51d with a negative phase shift relative to that of the signal it senses from track 51e. This phase shift between the two signals causes destructive interference and the combined signal picked up by read/write head 39 will have negative radial incoherence. Just like positive RI, negative RI occurs when read/write head 39 is in the middle of two radially adjacent servo fields of a servo wedge on radially adjacent tracks. When this occurs α=0.5. Both the on-track and off-track signals have the same shape, but the off-track signal precedes the on-track signal by one coded bit cycle. The off-track signal can be expressed as:

$$y(t)=x(t+T) \quad (4)$$

where T is the coded bit cycle.

Trajectory 74 represents the relative movement of read/write head 39 in a radial direction across tracks from track 51e to 51d. As read/write head 39 moves between the two tracks 51e and 51d, the signal from track 51e grows weaker as the head moves away from the center of the track and the signal from track 51d grows stronger as the head moves toward the center of track 51d. Relative to the position of the servo fields on track 51e, the servo fields on track 51d are not as far along the polar axis in the direction of the read/write head's relative movement. Accordingly, read/write head 39 senses a signal from track 51d with a negative phase shift relative to that of the signal it senses from 51e. This phase shift between the two signals causes destructive interference and the combined signal picked up by read/write head 39 as it moves radially across the tracks will have negative radial incoherence.

Figure 3D:
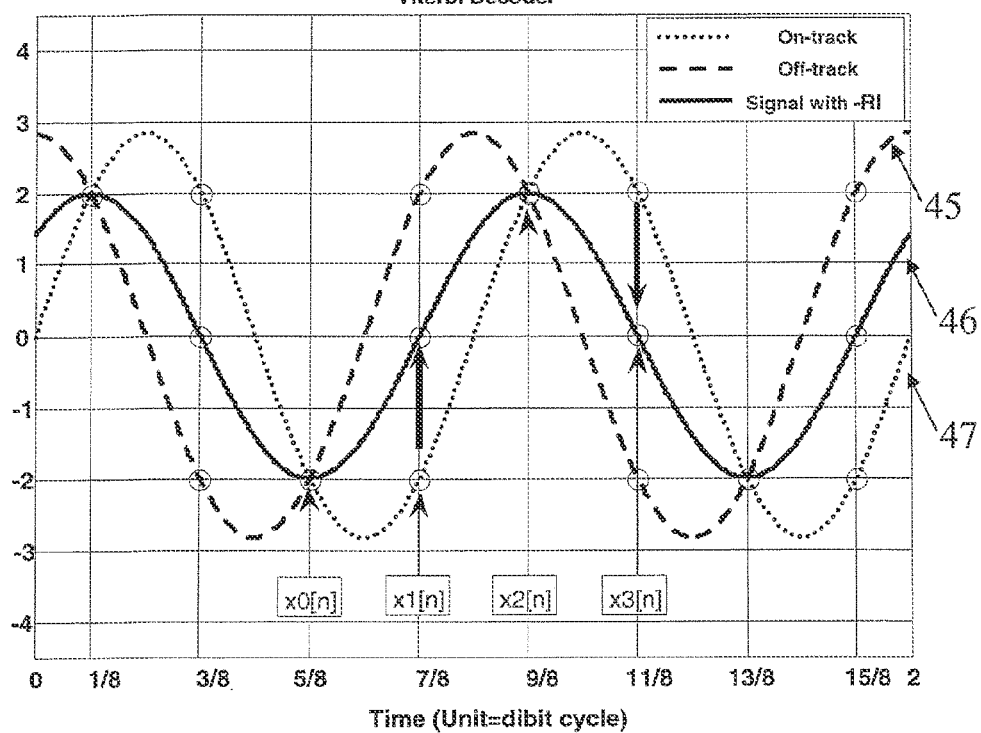
FIG. 3D is an illustration of a signal with negative RI.

FIG. 3D is a phase diagram depicting the occurrence of negative RI. Waveform 47 depicts an on-track signal. Waveform 45 depicts an off-track signal. And waveform 46 depicts the combination of the on-track and off-track signals, which results in a signal with negative radial incoherence.

Figure 4:
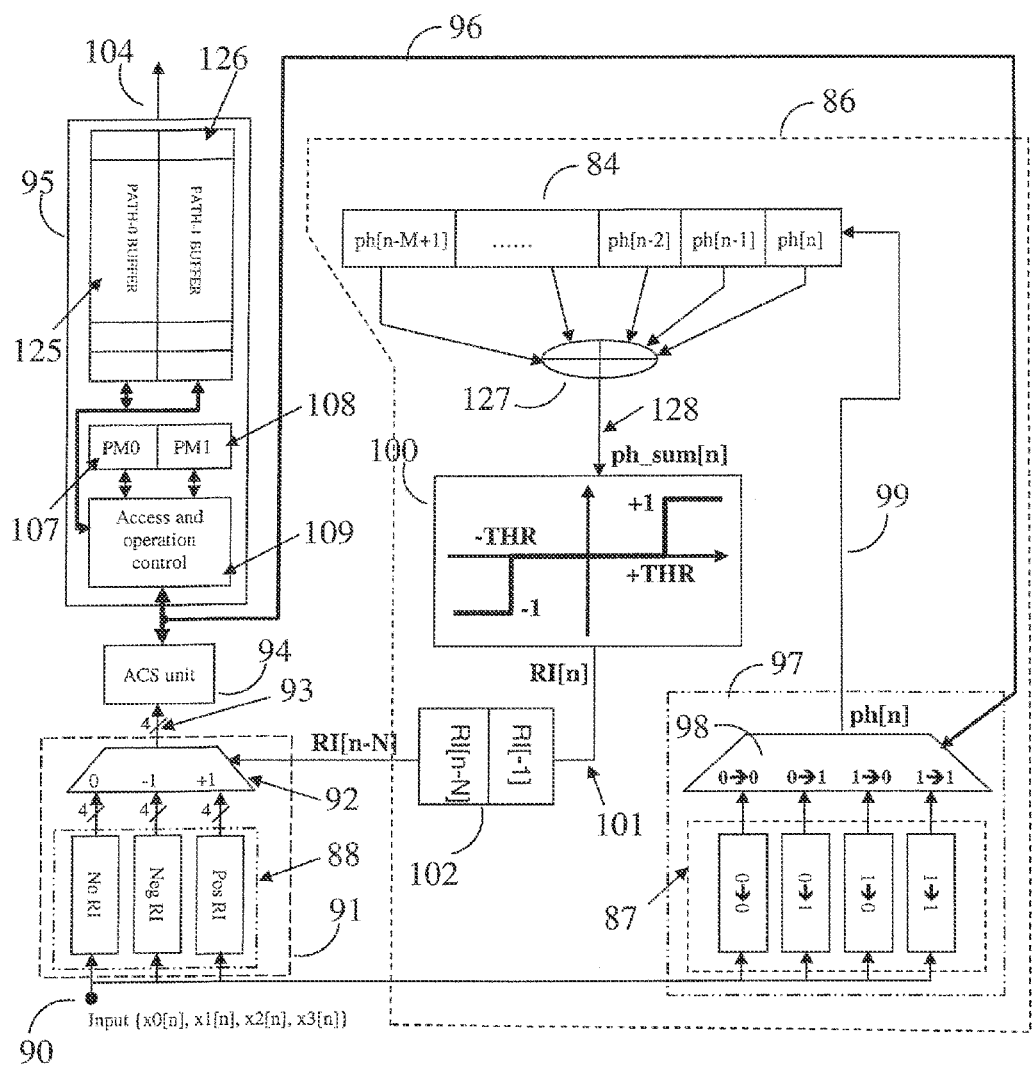
FIG. 4 is a block diagram of a decoder with RI detector consistent with certain aspects related to the present invention.

FIG. 4 is a block diagram of a decoder 85 including a RI detector 86, consistent with certain aspects related to the present invention. Decoder 85 may be a two-state or four-state Viterbi or maximum-likelihood decoder and may comprise an input unit 91, an add-compare-select (ACS) unit 94, an output unit 95, and RI detector 86. Input unit 91 may further comprise a branch metric unit 88 and a branch metric selector 92. In addition, RI detector 86 may further comprise a second input unit 97, a phase buffer 84, phase adder 127, and a decision unit 100. Second input unit 97 may further comprise a phase estimator 87 and a phase selector 98. It will be understood by one of skill in the art that decoder 85 may provide for more than two or four states.

Decoder 85 receives an input data stream at an input terminal 90. Input data stream may comprise $x_0[n]$, $x_1[n]$, $x_2[n]$, and $x_3[n]$, a user bit that corresponds to four coded bits and represents one transition. The input data stream originates as an analog signal picked up by read/write head 39 (FIG. 2). The analog signal is then passed through circuitry (not shown), such as an AFE, an ADC, and a digital equalizer to produce a digital input data stream. It is expected that the overall response at the output of the equalizer and the input of decoder 85 will match a known target. Two typically used targets are a PR4 target and matched filter PR4 (MFPR4) target.

In decoding the input data stream, decoder 85 may employ a trellis diagram, also called a state transition diagram, to determine a bit sequence most likely to have been recorded on the storage medium out of all possible bit sequences that may have been recorded. The PR4 and MFPR4 targets use different trellis diagrams.

The PR4 target response may be expressed as:

$$H(D)=1+0D-D^2 \quad (5)$$

where H(D) is a transfer function of the PR4 target and D is an integer coefficient implementing the transfer function. The PR4 target may be represented as a vector of tap weights [2, 0, -2] where a scaling factor of 2 has been used.

Figure 5A:
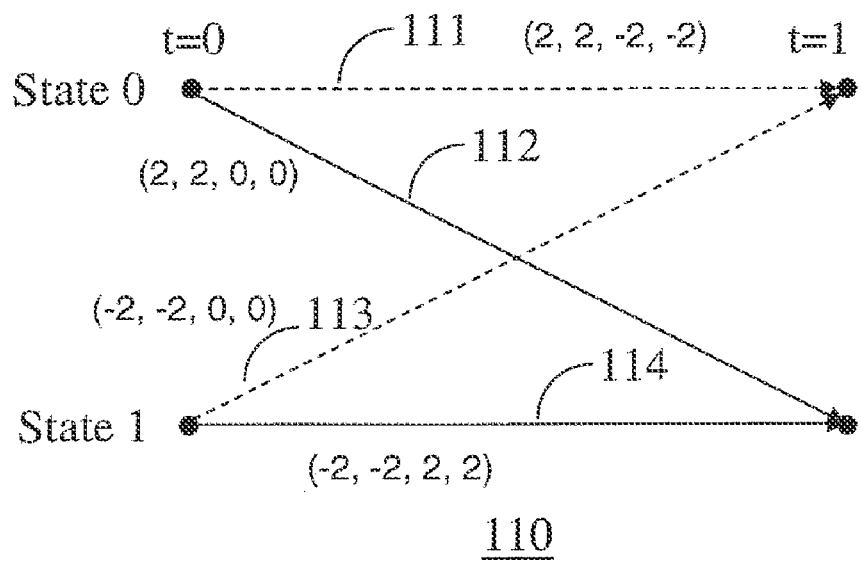
FIG. 5A is a two-state trellis diagram for a PR4 target.

Referring to FIG. 5A, a trellis diagram 110 corresponding to a PR4 target is shown. Trellis diagram 110 depicts a two-state trellis beginning at time instant t=0 and ending at time instant t=1. Each possible transition from a current state to a next state is depicted by a solid or dashed line and is called a branch. For example, at time t=0, branches 111 and 112 start at current state 0 and branches 113 and 114 start at current state 1. Possible next states include 0 or 1 following a next user bit of 0 or 1. The dashed lines, branches 111 and 113, represent a next user bit of 0 and the solid lines, branches 112 and 114, represent a next user bit of 1.

The memory length of a PR4 target is one user bit, which corresponds to four coded bits. Accordingly, each branch 111-114 can be represented by the four ideal output samples that correspond to the particular transition. The 0→0 transition shown by branch 111 may be represented as (2, 2, -2, -2). The 0→1 transition shown by branch 112 may be represented as (2, 2, 0, 0). The 1→0 transition shown by branch 113 may be represented as (-2, -2, 0, 0). The 1→1 transition shown by branch 114 may be represented as (-2, -2, 2, 2). A path through the trellis is represented by a sequence of state transitions or branches over time.

Figure 6A:
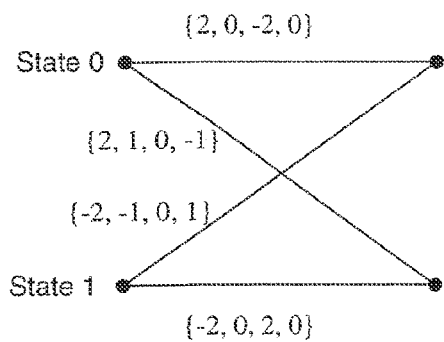
FIGS. 6A-E are modified two-state trellis diagrams for a PR4 target consistent with certain aspects related to the present invention.
Figure 6B:
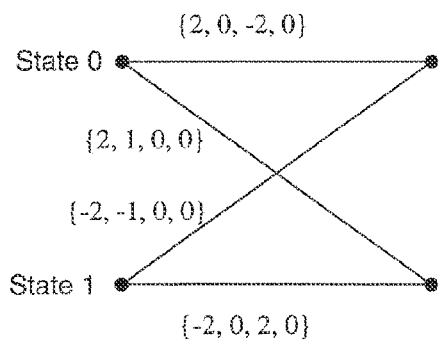
Figure 6C:
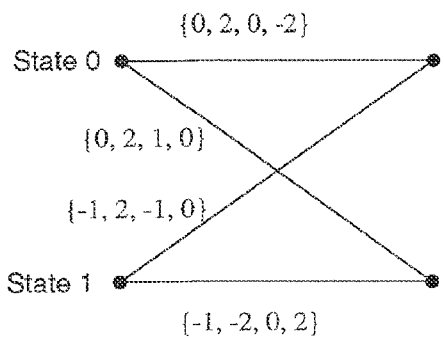

The trellis diagram 110 of FIG. 5A corresponds to a PR4 target without RI. In FIGS. 6A-E, modified trellis diagrams accounting for different RI types corresponding to a PR4 target are shown. In FIG. 6A, a trellis diagram for a signal with negative RI in which the previous and future user bits do not matter is shown. In FIG. 6B, a trellis diagram used in a servo channel for a signal with negative RI is shown. In FIG.

Figure 6D:
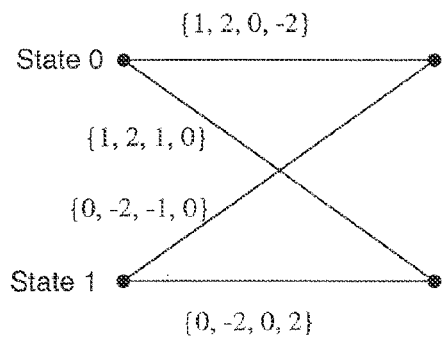
Figure 6E:
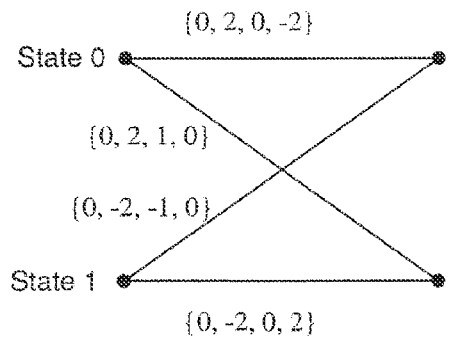

6C, a trellis diagram for a signal with positive RI and a previous user bit of 0 is shown. In FIG. 6D, a trellis diagram for a signal with positive RI and a previous user bit of 1 is shown. In FIG. 6E, a trellis diagram used in a servo channel for a signal with positive RI is shown.

The MFPR4 target response may be expressed as:

$$H(D)=-1+0D+2D^2+0D^3-1D^4 \quad (5)$$

where H(D) is a transfer function of the MFPR4 target and D is an integer coefficient implementing the transfer function. The MFPR4 target may be represented as a vector of tap weights [−1, 0, 2, 0, −1].

Figure 5B:
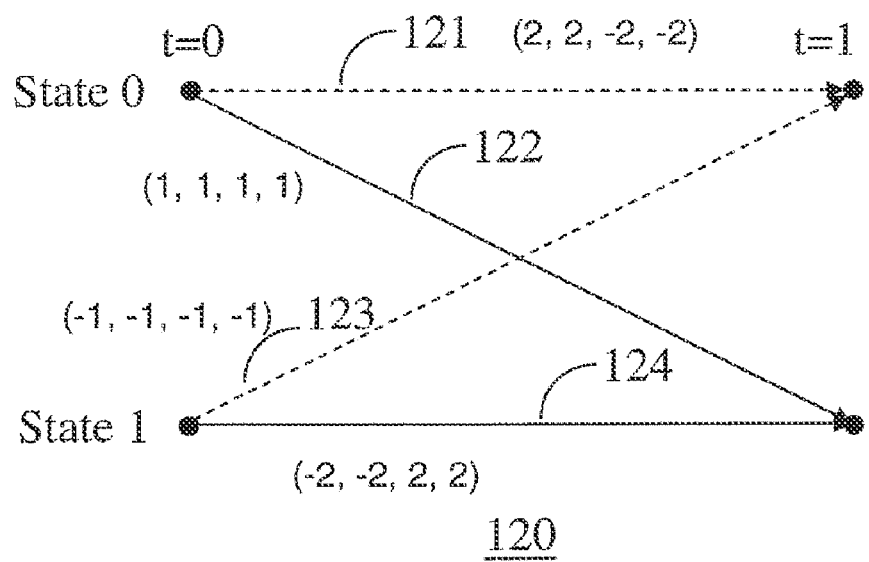
FIG. 5B is a two-state trellis diagram for a MFPR4 target.

Referring to FIG. 5B, a trellis diagram 120 corresponding to a MFPR4 target is shown. Trellis diagram 120 depicts a two-state trellis beginning at time instant t=0 and ending at time instant t=1. Each possible transition from a current state to a next state is depicted by a solid or dashed line and is called a branch. For example, at time t=0, branches 121 and 122 start at current state 0 and branches 123 and 124 start at current state 1. Possible next states include 0 or 1 following a next user bit of 0 or 1. The dashed lines, branches 121 and 123, represent a next user bit of 0 and the solid lines, branches 122 and 124, represent a next user bit of 1.

The memory length of a MFPR4 target is one user bit, which corresponds to four coded bits. Accordingly, each branch 121-124 can be represented by the four ideal output samples that correspond to the particular transition. The 0→0 transition shown by branch 121 may be represented as (2, 2, −2, −2). The 0→1 transition shown by branch 122 may be represented as (1, 1, 1, 1). The 1→0 transition shown by branch 123 may be represented as (−1, −1, −1, −1). The 1→1 transition shown by branch 124 may be represented as (−2, −2, 2, 2). A path through the trellis is represented by a sequence of state transitions or branches over time.

Figure 7A:
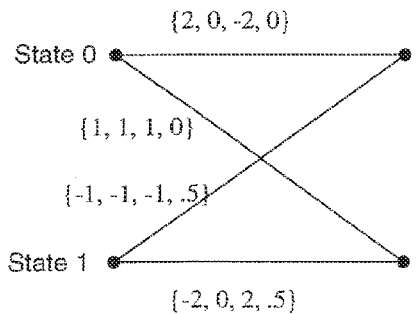
FIGS. 7A-F are modified two-state trellis diagrams for a MFPR4 target consistent with certain aspects related to the present invention.
Figure 7B:
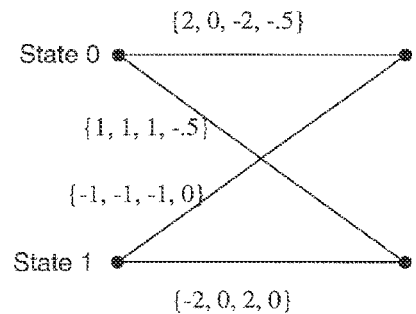
Figure 7C:
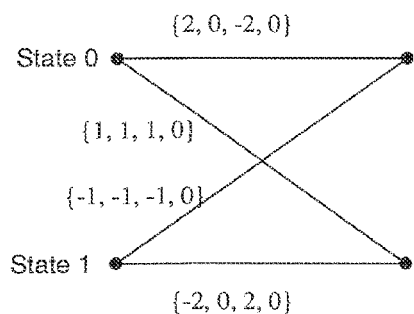
Figure 7D:
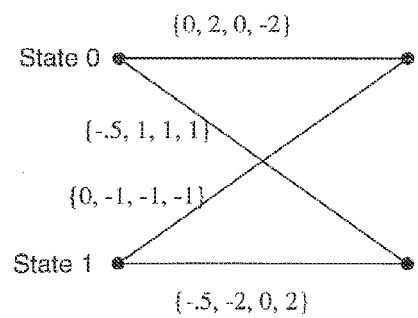
Figure 7E:
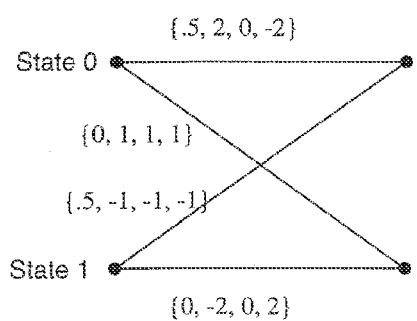
Figure 7F:
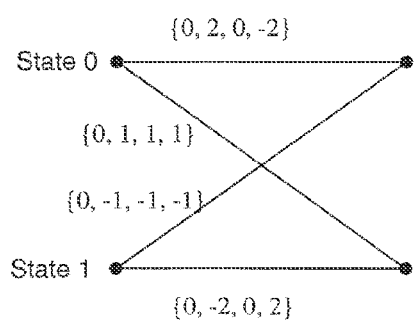

The trellis diagram 120 of FIG. 5B corresponds to a MFPR4 target without RI. In FIGS. 7A-F, modified trellis diagrams accounting for different RI types and corresponding to a MFPR4 target are shown. In FIG. 7A, a trellis diagram for a signal with negative RI and a next user bit of 0 is shown. In FIG. 7B, a trellis diagram for a signal with negative RI and a next user bit of 1 is shown. In FIG. 7C, a trellis diagram used in a servo channel for a signal with negative RI is shown. In FIG. 7D, a trellis diagram for a signal with positive RI and a previous user bit of 0 is shown. In FIG. 7E, a trellis diagram for a signal with positive RI and a previous user bit of 1 is shown. In FIG. 7F, a trellis diagram used in a servo channel for a signal with positive RI is shown.

Referring again to FIG. 4, input terminal 90 supplies an input data signal originating from read/write head 39 (FIG. 2) to input unit 91 and Second input unit 97. From the input data stream, branch metric unit 88 within input unit 91 identifies all possible transitions in the input data stream (i.e., all transitions in the applicable trellis diagrams) and calculates a branch metric value for each. The branch metric for each branch represents the probability or likelihood that that branch is the most likely transition in the input data stream. Branch metric unit 88 may use a set of well-known predetermined and preprogrammed calculations or it may use a variety of calculations adaptive to several conditions to determine each branch metric. For instance, branch metric values may be calculated using Euclidean-based branch metric equations, Manhattan-based branch metric equations, or Hamming-based branch metric equations. Branch metric unit 88 may also use a set of three different trellis diagrams or three different sets of calculations to calculate branch metric values for transitions not influenced by RI, transitions influenced by positive RI, and transitions influenced by negative RI.

The Euclidean-based branch metrics calculations associated with each transition, assuming a signal with no RI, for a PR4 target may be written as:

$$0 \rightarrow 0 - 2x_0[n] - 2x_1[n] + 2x_2[n] + 2x_3[n] + 8 \quad (6)$$

$$1 \rightarrow 0 \; 2x_0[n] + 2x_1[n] + 4$$

$$0 \rightarrow 1 - 2x_0[n] - 2x_1[n] + 4$$

$$1 \rightarrow 1 \; 2x_0[n] + 2x_1[n] - 2x_2[n] - 2x_3[n] + 8$$

where $x_0[n]$, $x_1[n]$, $x_2[n]$, and $x_3[n]$ are the individual data points in the input data stream at an n-th transition.

The Euclidean-based branch metrics calculations associated with each transition, assuming an input signal with negative RI, for a PR4 target may be written as:

$$0 \rightarrow 0 - 2x_0[n] + 2x_2[n] + 4 \quad (7)$$

$$1 \rightarrow 0 \; 2x_0[n] + x_1[n] + 2.5$$

$$0 \rightarrow 1 - 2x_0[n] - x_1[n] + 2.5$$

$$1 \rightarrow 1 \; 2x_0[n] - 2x_2[n] + 4$$

where $x_0[n]$, $x_1[n]$, $x_2[n]$, and $x_3[n]$ are the individual data points in the input data stream at an n-th transition.

The Euclidean-based branch metrics calculations associated with each transition, assuming an input signal with positive RI, for a PR4 target may be written as:

$$0 \rightarrow 0 - 2x_1[n] + 2x_3[n] + 4 \quad (8)$$

$$1 \rightarrow 0 \; 2x_1[n] + x_2[n] + 2.5$$

$$0 \rightarrow 1 - 2x_1[n] - x_2[n] + 2.5$$

$$1 \rightarrow 1 \; 2x_1[n] - 2x_3[n] + 4$$

where $x_0[n]$, $x_1[n]$, $x_2[n]$, and $x_3[n]$ are the individual data points in the input data stream at an n-th transition.

The Euclidean-based branch metrics calculations associated with each transition, assuming a signal with no RI, for a MFPR4 target may be written as:

$$0 \rightarrow 0 - 2x_0[n] - 2x_1[n] + 2x_2[n] + 2x_3[n] + 8 \quad (9)$$

$$1 \rightarrow 0 \; x_0[n] + x_1[n] + x_2[n] + x_3[n] + 2$$

$$0 \rightarrow 1 - x_0[n] - x_1[n] - x_2[n] - x_3[n] + 2$$

$$1 \rightarrow 1 \; 2x_0[n] + 2x_1[n] - 2x_2[n] - 2x_3[n] + 8$$

where $x_0[n]$, $x_1[n]$, $x_2[n]$, and $x_3[n]$ are the individual data points in the input data stream at an n-th transition.

The Euclidean-based branch metrics calculation associated with each transition, assuming a signal with negative RI, for a MFPR4 target may be written as:

$$0 \rightarrow 0 - 2x_0[n] + 2x_2[n] + 4 \quad (10)$$

$$1 \rightarrow 0 \; x_0[n] + x_1[n] + x_2[n] + 1.5$$

$$0 \rightarrow 1 - x_0[n] - x_1[n] - x_2[n] + 1.5$$

$$1 \rightarrow 1 \; 2x_0[n] - 2x_2[n] + 4$$

where $x_0[n]$, $x_1[n]$, $x_2[n]$, and $x_3[n]$ are the individual data points in the input data stream at an n-th transition.

The Euclidean-based branch metrics calculations associated with each transition, assuming a signal with positive RI, for a MFPR4 target may be written as:

$$0 \to 0 - 2x_1[n] + 2x_3[n] + 4 \tag{11}$$

$$1 \to 0 x_1[n] + x_2[n] + x_3[n] + 1.5$$

$$0 \to 1 - x_1[n] - x_2[n] - x_3[n] + 1.5$$

$$1 \to 1\ 2x_1[n] - 2x_3[n] + 4$$

where $x_0[n]$, $x_1[n]$, $x_2[n]$, and $x_3[n]$ are the individual data points in the input data stream at an n-th transition.

Branch metric unit 88 supplies a set of branch metrics for each identified transition, influenced by positive RI, negative RI, and no RI to branch metric selector 92 within input unit 91. Branch metric selector 92 is coupled to branch metric unit 88 and decision unit 100 within RI detector 89. From decision unit 100 branch metric selector 92 receives a RI flag 101 that can be shown as RI[n-N], where n represents the n-th input transition and N is a positive integer and represents the overall pipeline latency with respect to the input data signal at input terminal 90. Based on whether RI flag 101 indicates positive RI, negative RI, or no RI, branch metric selector 92 selects a corresponding subset of transitions 93 from the transitions identified by branch metric unit 88.

Branch metric selector 92 is coupled to ACS unit 94 and supplies subset of transitions 93 to ACS unit 94, which determines possible surviving paths from the transitions in subset of transitions 93. The possible surviving paths evolve from previously determined surviving paths. The path metric value for each possible surviving path is calculated using the branch metric of each transition in subset of transitions 93 and the path metric values of previously determined surviving paths, where the path metric values for the previously determined surviving paths are stored in PM0 107 and PM1 108 in output unit 95. Comparing the path metric values for each possible surviving path merging at a same state, ACS unit 94 determines a surviving path associated with each trellis state. The path metric for the surviving paths are stored in PM0 107 and PM1 108 in output unit 95. This is equivalent to extending each previously determined surviving path by adding one new branch to it, where the newly added branches are selected from subset of transitions 93. ACS unit 94 then compares the path metrics for the surviving paths to determine a best surviving path. ACS unit 94 selects a most recent transition in the best surviving path, a selected transition 96, which is one of the newly added branches. Selected transition 96 is supplied to output unit 95 and also to phase selector 98 within second input unit 97.

ACS unit 94 is coupled to output unit 95 and supplies the path metric value for the surviving path associated with each trellis state, the newly added branches, the best surviving path, and selected transition 96 to output unit 95. PM0 107 in output unit 95 stores the path metric value for the surviving path associated with state 0. PM1 108 in output unit 95 stores the path metric value for the surviving path associated with state 1. Access and operation control unit (control unit) 109 may extend the previously determined surviving paths stored in path buffers 125 and 126 by first shuffling them based on the path metric value for the surviving path associated with each trellis state and then adding, at the end of the previously determined surviving paths, the newly determined branches. Control unit 109 keeps track of the best surviving path.

Output unit 95 may also compare a plurality of subset of transitions 93 and a plurality of selected transitions 96, the best surviving path, to generate a decoded data signal 104. For instance, using the best surviving path and its path metric value, output unit 95 may follow every transition in the best surviving path from a current time backwards to a fixed trace depth to determine the correctness of the best surviving path calculated by ACS unit 94. Output unit 95 then constructs a corrected best surviving path from which it outputs a decoded data signal 104.

Input terminal 90 also supplies second input unit 97, within RI detector 86, with the input data stream. Phase estimator 87 within second input unit 97 generates an estimated phase from the input data stream for each possible transition within the input data stream. For example, given the two states 0 and 1, phase estimator 87 generates phase estimates for the following four transitions: $0 \to 0$; $0 \to 1$; $1 \to 0$; and $1 \to 1$. Like branch metric unit 88, phase estimator 87 may use a set of well-known predetermined and preprogrammed calculations or it may use a variety of calculations adaptive to several conditions to generate the estimated phase for each transition.

The RI phase associated with each transition for a PR4 target may be estimated by using:

$$0 \to 0 (-x_0[n] + x_1[n] + x_2[n] - x_3[n])/wt12 \tag{12}$$

$$1 \to 0 (x_0[n] - x_1[n])/2$$

$$0 \to 1 (x_1[n] - x_0[n])/2$$

$$1 \to 1 (x_0[n] - x_1[n] + x_3[n] - x_2[n])/wt12$$

where $x_0[n]$, $x_1[n]$, $x_2[n]$, and $x_3[n]$ are the individual data points in the input data stream at an n-th transition and wt12 is a scaling factor used to balance the estimated phase and its variance for different transitions.

The RI phase associated with each transition for a MFPR4 target may be estimated by using:

$$0 \to 0 (-x_0[n] + x_1[n] + x_2[n] - x_3[n])/wt12 \tag{13}$$

$$1 \to 0 x_0[n] - x_3[n]$$

$$0 \to 1 x_0[n] + x_3[n]$$

$$1 \to 1 (x_0[n] - x_1[n] - x_2[n] + x_3[n])/wt12$$

where $x_0[n]$, $x_1[n]$, $x_2[n]$, and $x_3[n]$ are the individual data points in the input data stream at an n-th transition and wt12 is a scaling factor used to balance the estimated phase and its variance for different transitions.

Phase estimator 87 supplies the generated estimated phases to phase selector 98 within second input unit 97. Phase selector 98 also receives selected transition 96 from ACS unit 94 or output unit 95. In response to selected transition 96, phase selector 98 selects an estimated phase 99.

Phase selector 98 supplies selected estimated phase 99 to phase buffer 84. Phase buffer 84 is coupled to phase selector 98 and phase adder 127. Phase buffer 84 receives and stores the M most recent values of selected estimated phase 99, where M is a positive integer. The larger the value of M, the more any noise in the input data signal will be compressed. However, the larger the value of M, the slower the response of decoder 85 and RI detector 86 to a RI type change. Phase buffer 84 sends the M most recent values of selected estimated phase 99 to phase adder 127.

Phase adder 127 calculates a moving sum ph_sum[n] 128 of the M most recent values of selected estimated phase 99 from the phase buffer 84. Decision unit 100 receives ph_sum [n] 128 from phase adder 127. Decision unit 100 may use a fixed threshold value, a set of fixed threshold values, or other ways of obtaining a detection threshold value consistent with the present invention to determine whether RI exists and if so, whether it is positive or negative. For example, decision unit 100 may compare the value of ph_sum[n] 128 against two present threshold values, −THR and +THR, to determine whether there exists positive RI, negative RI, or no RI. Based on the comparison, decision unit 100 generates RI flag 101, which indicates positive RI, negative RI, or no RI. Decision unit 100 supplies RI flag 101 to branch metric selector 92 within input unit 91. Object 102 between decision unit 100 and branch metric selector 92 is merely illustrative of the overall pipeline latency N with respect to the input data signal at input terminal 90.

Figure 8:
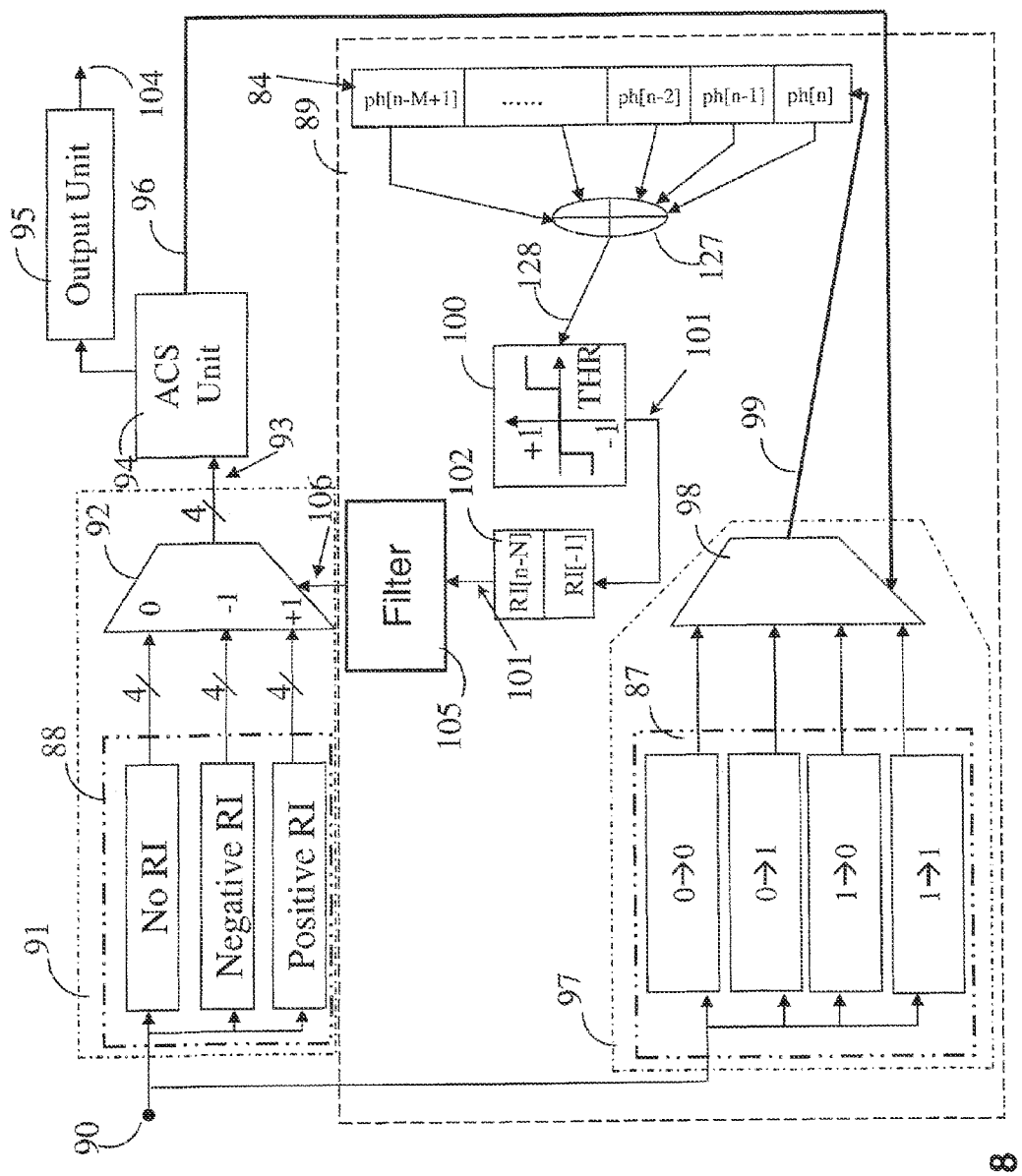
FIG. 8 is a block diagram of a decoder with RI detector and filter consistent with certain aspects related to the present invention.

FIG. 8 is a block diagram of a decoder 80 different from decoder 85 of FIG. 4. Decoder 80 includes a RI detector 89 having filter 105, consistent with certain aspects related to the present invention. Decoder 80 may be a two-state or four-state Viterbi or maximum-likelihood decoder and may comprise input unit 91, ACS unit 94, output unit 95, and RI detector 89. Input unit 91 may further comprise branch metric unit 88 and branch metric selector 92. In addition, RI detector 89 may further comprise second input unit 97, phase buffer 84, phase adder 127, decision unit 100, and filter 105. Second input unit 97 may further comprise phase estimator 87 and phase selector 98. It will be understood by one of skill in the art that decoder 80 may provide for more than two or four states.

Decoder 80 receives an input data stream conditioned in accordance with a PR4 or MFPR4 target, as previously described, at an input terminal 90. In decoding the input data stream, decoder 80 may employ trellis diagrams, as shown in FIGS. 5A, 5B, 6A-6E, and 7A-7F, to determine a bit sequence most likely to have been recorded on the storage medium out of all possible bit sequences that may have been recorded.

Referring again to FIG. 8, input terminal 90 supplies an input data signal originating from read/write head 39 (FIG. 2) to input unit 91 and second input unit 97. From the input data stream, branch metric unit 88 within input unit 91 identifies all possible transitions in the input data stream (i.e., all transitions in the applicable trellis diagrams) and calculates a branch metric value for each. The branch metric for each branch represents the probability or likelihood that that branch is the most likely transition in the input data stream. Branch metric unit 88 may use a set of well-known predetermined and preprogrammed calculations or it may use a variety of calculations adaptive to several conditions to determine each branch metric. For instance, branch metric values may be calculated using Euclidean-based branch metric equations, Manhattan-based branch metric equations, or Hamming-based branch metric equations. Branch metric unit 88 may also use a set of three different trellis diagrams or three different sets of calculations to calculate branch metric values for transitions not influenced by RI, transitions influenced by positive RI, and transitions influenced by negative RI, as described above in connection with Equations (6)-(11).

Branch metric unit 88 supplies a set of branch metrics for each identified transition, influenced by positive RI, negative RI, and no RI to branch metric selector 92 within input unit 91. Branch metric selector 92 is coupled to branch metric unit 88 and filter 105 within RI detector 89. From filter 105, branch metric selector 92 receives a RI type signal 106. Based on whether RI type signal 106 indicates positive RI, negative RI, or no RI, branch metric selector 92 selects a corresponding subset of transitions 93 from the transitions identified by branch metric unit 88.

Branch metric selector 92 is coupled to ACS unit 94 and supplies subset of transitions 93 to ACS unit 94, which determines possible surviving paths from the transition in subset of transitions 93. The possible surviving paths evolve from previously determined surviving paths. The path metric value for each possible surviving path is calculated using the branch metric of each transition in subset of transitions 93 and the path metric values of previously determined surviving paths, where the path metric values for the previously determined surviving paths are stored in output unit 95. Comparing the path metric values for each possible surviving path merging at a same state, ACS unit 94 determines a surviving path associated with each trellis state. The path metric for the surviving paths are stored in output unit 95. This is equivalent to extending each previously determined surviving path by adding one new branch to it, where the newly added branches are selected from subset of transitions 93. ACS unit 94 then compares the path metrics for the surviving paths to determine a best surviving path. ACS unit 94 selects a most recent transition in the best surviving path, a selected transition 96, which is one of the newly added branches. Selected transition 96 is supplied to output unit 95 and also to phase selector 98 within second input unit 97.

ACS unit 94 is coupled to output unit 95 and supplies the path metric value for the surviving path associated with each trellis state, the newly added branches, the best surviving path, and selected transition 96 to output unit 95. As described above, output unit 95 may extend the previously determined surviving paths and may also generate a decoded data signal 104.

Input terminal 90 also supplies second input unit 97, within RI detector 89, with the input data stream. Phase estimator 87 within second input unit 97 generates an estimated phase from the input data stream for each possible transition within the input data stream. For example, given the two states 0 and 1, phase estimator 87 generates phase estimates for the following four transitions: 0→0; 0→1; 1→0; and 1→1. Like branch metric unit 88, phase estimator 87 may use a set of well-known predetermined and preprogrammed calculations or it may use a variety of calculations adaptive to several conditions to generate the estimated phase for each transition. Phase estimator 87 may also estimate the phase associated with each transition using Equations (12) and (13), as described above.

Phase estimator 87 supplies the generated estimated phases to phase selector 98 within second input unit 97. Phase selector 98 also receives selected transition 96 from ACS unit 94. In response to selected transition 96, phase selector 98 selects an estimated phase 99.

Phase selector 98 supplies selected estimated phase 99 to phase buffer 84. Phase buffer 84 is coupled to phase selector 98 and phase adder 127. Phase buffer 84 receives and stores the M most recent values of selected estimated phase 99, where M is a positive integer. The larger the value of M, the more any noise in the input data signal will be compressed. However, the larger the value of M, the slower the response of decoder 80 and RI detector 89 to a RI type change. Phase buffer 84 sends the M most recent values of selected estimated phase 99 to phase adder 127.

Phase adder 127 calculates a moving sum ph_sum[n] 128 of the M most recent values of selected estimated phase 99 from the phase buffer 84. Decision unit 100 receives ph_sum[n] 128 from phase adder 127. Decision unit 100 may use a fixed threshold value, a set of fixed threshold values, or other ways of obtaining a detection threshold value consistent with certain aspects related to the present invention to determine whether RI exists and if so, whether it is positive or negative. For example, decision unit 100 may compare the value of ph_sum[n] 128 against two present threshold values, −THR and +THR, to determine whether there exists positive RI, negative RI, or no RI. Based on the comparison, decision unit 100 generates RI flag 101, which indicates positive RI, negative RI, or no RI. Decision unit 100 supplies RI flag 101 to filter 105. Object 102 between decision unit 100 and filter 105 is merely illustrative of the overall pipeline latency N with respect to the input data signal at input terminal 90.

Decision unit 100 supplies RI flag 101 to filter 105. Filter 105 is coupled between decision unit 100 and branch metric selector 92 to filter out noise or other errors which may distort or affect the RI flag. Assuming noise and other errors do not occur in burst, filter 105 corrects the error. For instance, RI flags within a sequence of RI flags stored in filter 105 or a separate buffer (not shown) may indicate positive RI at a series of discrete time instants, indicate no RI at another time instant, and then again indicate positive RI at a series of discrete time instants (ex. {1, 1, 1, 1, 1, 0, 1, 1, 1, 1}) due to error, noise, or other factors causing distortion of the RI flags. Filter 105 detects and corrects for such noise and error, generating a RI type signal 106, which may have values of 1, 0, and −1. In the above example, RI type signal 106 would be "1." Filter 105 may be a non-linear filter such as a median filter. A separate buffer (not shown) for storing the sequence of RI flags may also be used by filter 105. In the present embodiment, filter 105 receives RI flags and stores a sequence of RI flags, compares the flags in the sequence, and generates a RI type signal 106 based upon the comparison. RI type signal 106 is then supplied to the branch metric selector 92 within input unit 91.

Figure 9:
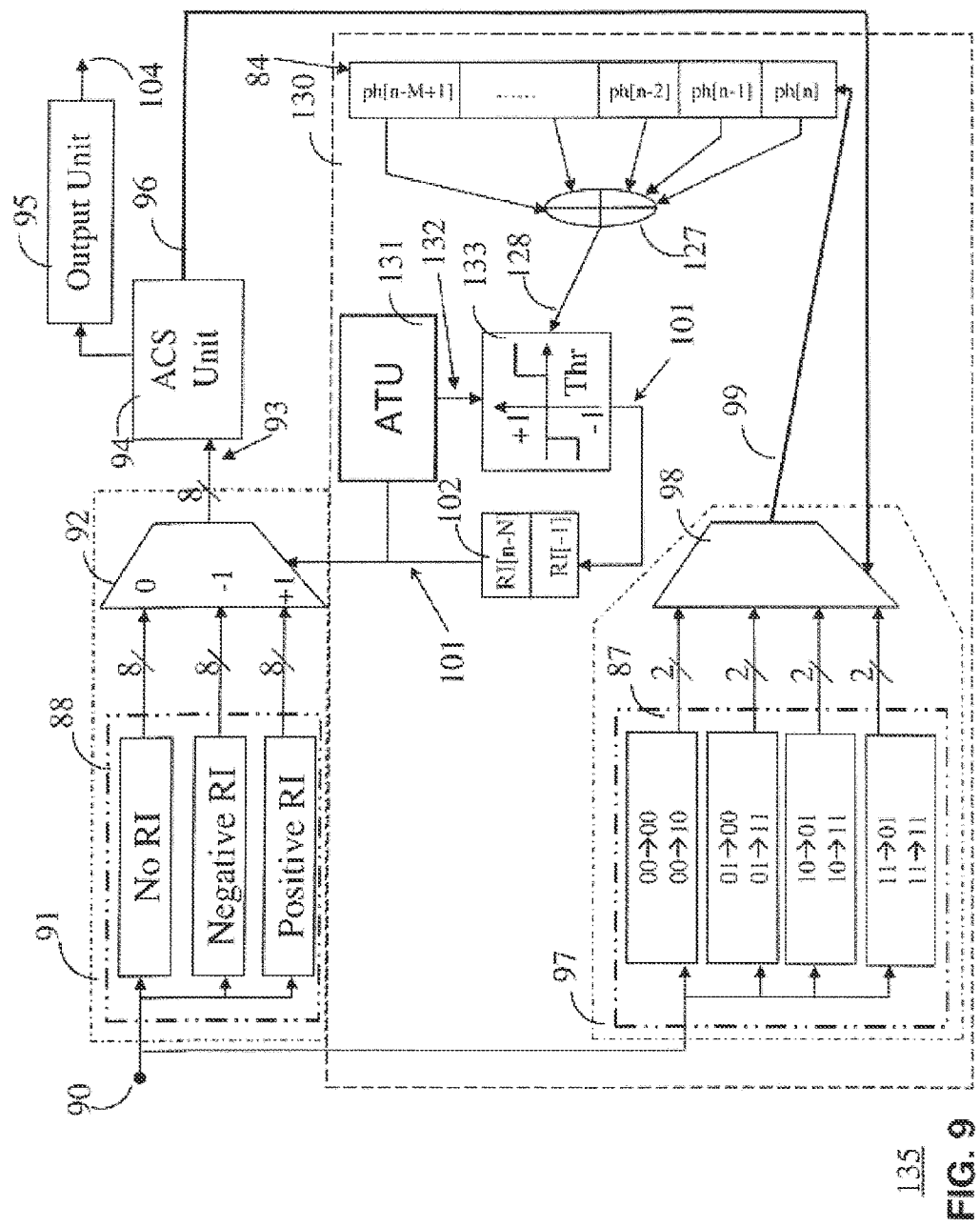
FIG. 9 is a block diagram of a decoder with RI detector and adaptive threshold unit consistent with certain aspects related to the present invention.

FIG. 9 is a block diagram of a decoder 135 different from decoder 85 of FIG. 4 and decoder 80 of FIG. 8. Decoder 135 includes a RI detector 130 having an adaptive threshold unit 131 consistent with certain aspects related to the present invention, but does not include filter 105 of decoder 80 (FIG. 4). Decoder 135 may be a two-state or four-state Viterbi or maximum-likelihood decoder and may comprise input unit 91, ACS unit 94, output unit 95, and RI detector 130. Input unit 91 may further comprise a branch metric unit 88 and a branch metric selector 92. In addition, RI detector 130 may further comprise second input unit 97, phase buffer 84, phase adder 127, a decision unit 133 different from decision unit 100, and adaptive threshold unit 131. Second input unit 97 may further comprise phase estimator 87 and phase selector 98. It will be understood by one of skill in the art that decoder 135 may provide for more than two or four states.

Decoder 135 receives an input data stream conditioned in accordance with a PR4 or MFPR4 target, as previously described, at an input terminal 90. In decoding the input data stream, decoder 135 may employ trellis diagrams, as shown in FIGS. 5A, 5B, 6A-6E, and 7A-7F, to determine a bit sequence most likely to have been recorded on the storage medium out of all possible bit sequences that may have been recorded.

Referring again to FIG. 9, input terminal 90 supplies an input data signal originating from read/write head 39 (FIG. 2) to input unit 91 and second input unit 97. From the input data stream, branch metric unit 88 within input unit 91 identifies all possible transitions in the input data stream (i.e., all transitions in the applicable trellis diagrams) and calculates a branch metric value for each. The branch metric for each branch represents the probability or likelihood that that branch is the most likely transition in the input data stream. Branch metric unit 88 may use a set of well-known predetermined and preprogrammed calculations or it may use a variety of calculations adaptive to several conditions to determine each branch metric. For instance, branch metric values may be calculated using Euclidean-based branch metric equations, Manhattan-based branch metric equations, or Hamming-based branch metric equations. Branch metric unit 88 may also use a set of three different trellis diagrams or three different sets of calculations to calculate branch metric values for transitions not influenced by RI, transitions influenced by positive RI, and transitions influenced by negative RI, as described above in connection with Equations (6)-(11).

Branch metric unit 88 supplies a set of branch metrics for each identified transition, influenced by positive RI, negative RI, and no RI to branch metric selector 92 within input unit 91. Branch metric selector 92 is coupled to branch metric unit 88 and decision unit 133 within RI detector 135. From decision unit 133, branch metric selector 92 receives a RI flag 101. Based on whether RI flag 101 indicates positive RI, negative RI, or no RI, branch metric selector 92 selects a corresponding subset of transitions 93 from the transitions identified by branch metric unit 88.

Branch metric selector 92 is coupled to ACS unit 94 and supplies subset of transitions 93 to ACS unit 94, which determines possible surviving paths from the transition in subset of transitions 93. The possible surviving paths evolve from previously determined surviving paths. The path metric value for each possible surviving path is calculated using the branch metric of each transition in subset of transitions 93 and the path metric values of previously determined surviving paths, where the path metric values for the previously determined surviving paths are stored in output unit 95. Comparing the path metric values for each possible surviving path merging at a same state, ACS unit 94 determines a surviving path associated with each trellis state. The path metric for the surviving paths are stored in output unit 95. This is equivalent to extending each previously determined surviving path by adding one new branch to it, where the newly added branches are selected from subset of transitions 93. ACS unit 94 then compares the path metrics for the surviving paths to determine a best surviving path. ACS unit 94 selects a most recent transition in the best surviving path, a selected transition 96, which is one of the newly added branches. Selected transition 96 is supplied to output unit 95 (not shown) and also to phase selector 98 within second input unit 97.

ACS unit 94 is coupled to output unit 95 and supplies the path metric value for the surviving path associated with each trellis state, the newly added branches, the best surviving path, and selected transition 96 to output unit 95. As described above, output unit 95 may extend the previously determined surviving paths and may also generate a decoded data signal 104.

Input terminal 90 also supplies second input unit 97, within RI detector 130, with the input data stream. Phase estimator 87 within second input unit 97 generates an estimated phase from the input data stream for each possible transition within the input data stream. For example, given the two states 0 and 1, phase estimator 87 generates phase estimates for the following four transitions: 0→0; 0→1; 1→0; and 1→1. Like branch metric unit 88, phase estimator 87 may use a set of well-known predetermined and preprogrammed calculations or it may use a variety of calculations adaptive to several conditions to generate the estimated phase for each transition. Phase estimator 87 may also estimate the phase associated with each transition using Equations (12) and (13), as described above.

Phase estimator 87 supplies the generated estimated phases to phase selector 98 within second input unit 97. Phase selector 98 also receives selected transition 96 from ACS unit 94. In response to selected transition 96, phase selector 98 selects an estimated phase 99.

Phase selector 98 supplies selected estimated phase 99 to phase buffer 84. Phase buffer 84 is coupled to phase selector 98 and phase adder 127. Phase buffer 84 receives and stores the M most recent values of selected estimated phase 99, where M is a positive integer. The larger the value of M, the more any noise in the input data signal will be compressed. However, the larger the value of M, the slower the response of decoder 135 and RI detector 130 to a RI type change. Phase buffer 84 sends the M most recent values of selected estimated phase 99 to phase adder 127.

Phase adder 127 calculates a moving sum ph_sum[n] 128 of the M most recent values of selected estimated phase 99 from the phase buffer 84. Decision unit 133 receives ph_sum[n] 128 from phase adder 127. Decision unit 133 is coupled to phase adder 127, adaptive threshold unit 131, and branch metric selector 92. Decision unit 133 also receives an adaptive threshold value 132 from adaptive threshold unit 131. Ph_sum[n] 128 is compared against adaptive threshold value 132 to determine whether there exists positive RI, negative RI, or no RI. Based on the comparison, decision unit 133 generates RI flag 101, which indicates positive RI, negative RI, or no RI. Decision unit 133 supplies RI flag 101 to branch metric selector 92 and adaptive threshold unit 131. Object 102 between decision unit 133 and branch metric selector 92 and adaptive threshold unit 131 is merely illustrative of the overall pipeline latency N with respect to the input data signal at input terminal 90.

Adaptive threshold unit 131 is coupled to decision unit 133 and supplies adaptive threshold value 132 to decision unit 133. Adaptive threshold unit 131 adjusts adaptive threshold value 132 as information is gained about the RI in the system from RI flag 101. For instance, when positive or negative RI exists, a conventional threshold value may fail to detect when RI exists if it is too high. And when no RI exists, conventional threshold value may detect false positives if it is too low. Thus, adaptive threshold unit 131 may output a pre-determined adaptive threshold value 132 when no information exists about RI in the system or RI flag 101 is empty. When RI flag 101 indicates no RI, adaptive threshold unit 131 may increase adaptive threshold value 132. To achieve this result, adaptive threshold unit 131 may multiply adaptive threshold value 132 by $\lambda_H$, where $\lambda_H$ is a parameter of adaptive threshold unit 131. When RI flag 101 indicates positive or negative RI, adaptive threshold unit 131 may decrease adaptive threshold value 132. To achieve this result, adaptive threshold unit 131 may multiply adaptive threshold value 132 by $\lambda_L$, where $\lambda_L$ is a parameter of adaptive threshold unit 131. In the present embodiment, adaptive threshold unit 131 stores an adaptive threshold value 132, receives RI flag 101, compares RI flag 101 with the adaptive threshold value 132, adjusts the adaptive threshold value based upon the comparison, supplies the adjusted adaptive threshold value to decision unit 133, and stores the adjusted adaptive threshold value as the adaptive threshold value.

Figure 10:
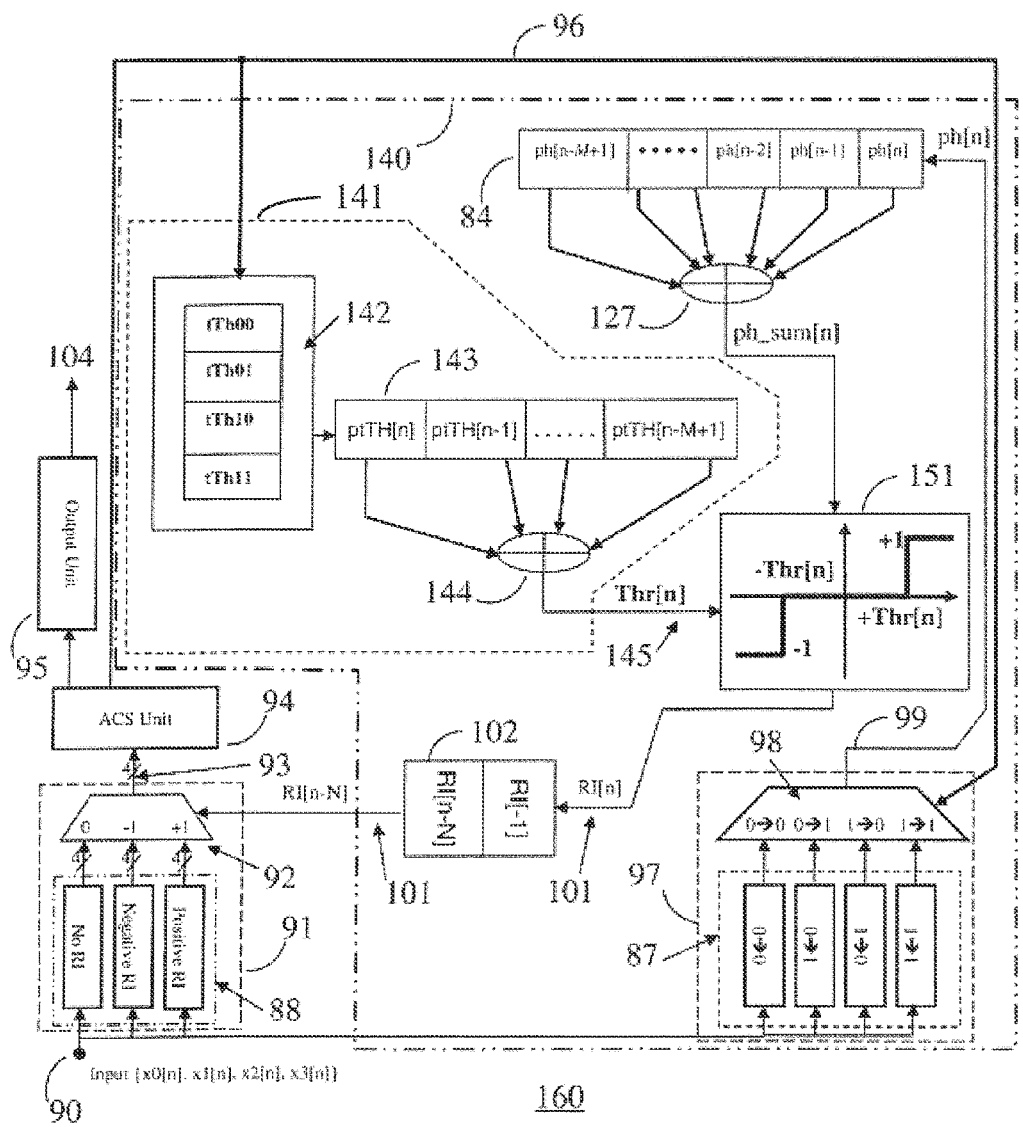
FIG. 10 is a block diagram of a decoder with RI detector and transition-based threshold unit consistent with certain aspects related to the present invention.

FIG. 10 is a block diagram of a decoder 160 different from decoders 85, 80, and 135. Decoder 160 includes a RI detector 140 having a transition-based threshold unit 141 consistent with certain aspects related to the present invention and does not include filter 105 of decoder 80 (FIG. 8) or adaptive threshold unit 131 of decoder 135 (FIG. 9). Decoder 160 may be a two-state or four-state Viterbi or maximum-likelihood decoder and may comprise input unit 91, ACS unit 94, output unit 95, and RI detector 140. Input unit 91 may further comprise branch metric unit 88 and branch metric selector 92. In addition, RI detector 140 may further comprise second input unit 97, phase buffer 84, phase adder 127, transition-based threshold unit 141, and a decision unit 151 different from decision units 100 and 133. Second input unit 97 may further comprise phase estimator 87 and phase selector 98. Transition-based threshold unit 141 may further comprise a threshold table 142, a threshold buffer 143, and a threshold adder 144. It will be understood by one of skill in the art that decoder 160 may provide for more than two or four states.

Decoder 160 receives an input data stream conditioned in accordance with a PR4 or MFPR4 target, as previously described, at an input terminal 90. In decoding the input data stream, decoder 160 may employ trellis diagrams, as shown in FIGS. 5A, 5B, 6A-6E, and 7A-7F, to determine a bit sequence most likely to have been recorded on the storage medium out of all possible bit sequences that may have been recorded.

Referring again to FIG. 10, input terminal 90 supplies an input data signal originating from read/write head 39 (FIG. 2) to input unit 91 and second input unit 97. From the input data stream, branch metric unit 88 within input unit 91 identifies all possible transitions in the input data stream (i.e., all transitions in the applicable trellis diagrams) and calculates a branch metric value for each. The branch metric for each branch represents the probability or likelihood that that branch is the most likely transition in the input data stream. Branch metric unit 88 may use a set of well-known predetermined and preprogrammed calculations or it may use a variety of calculations adaptive to several conditions to determine each branch metric. For instance, branch metric values may be calculated using Euclidean-based branch metric equations, Manhattan-based branch metric equations, or Hamming-based branch metric equations. Branch metric unit 88 may also use a set of three different trellis diagrams or three different sets of calculations to calculate branch metric values for transitions not influenced by RI, transitions influenced by positive RI, and transitions influenced by negative RI, as described above in connection with Equations (6)-(11).

Branch metric unit 88 supplies a set of branch metrics for each identified transition, influenced by positive RI, negative RI, and no RI to branch metric selector 92 within input unit 91. Branch metric selector 92 is coupled to branch metric unit 88 and decision unit 151 within RI detector 140. From decision unit 151, branch metric selector 92 receives RI flag 101. Based on whether RI flag 101 indicates positive RI, negative RI, or no RI, branch metric selector 92 selects a corresponding subset of transitions 93 from the transitions identified by branch metric unit 88.

Branch metric selector 92 is coupled to ACS unit 94 and supplies subset of transitions 93 to ACS unit 94, which determines possible surviving paths from the transition in subset of transitions 93. The possible surviving paths evolve from previously determined surviving paths. The path metric value for each possible surviving path is calculated using the branch metric of each transition in subset of transitions 93 and the path metric values of previously determined surviving paths, where the path metric values for the previously determined surviving paths are stored in output unit 95. Comparing the path metric values for each possible surviving path merging at a same state, ACS unit 94 determines a surviving path associated with each trellis state. The path metric for the surviving paths are stored in output unit 95. This is equivalent to extending each previously determined surviving path by adding one new branch to it, where the newly added branches are selected from subset of transitions 93. ACS unit 94 then compares the path metrics for the surviving paths to determine a best surviving path. ACS unit 94 selects a most recent transition in the best surviving path, a selected transition 96, which is one of the newly added branches. Selected transition 96 is supplied to output unit 95 (not shown) and also to phase selector 98 within second input unit 97.

ACS unit 94 is coupled to output unit 95 and supplies the path metric value for the surviving path associated with each trellis state, the newly added branches, the best surviving path, and selected transition 96 to output unit 95. As described above, output unit 95 may extend the previously determined surviving paths and may also generate a decoded data signal 104.

Input terminal 90 also supplies second input unit 97, within RI detector 140, with the input data stream. Phase estimator 87 within second input unit 97 generates an estimated phase from the input data stream for each possible transition within the input data stream. For example, given the two states 0 and 1, phase estimator 87 generates phase estimates for the following four transitions: 0→0; 0→1; 1→0; and 1→1. Like branch metric unit 88, phase estimator 87 may use a set of well-known predetermined and preprogrammed calculations or it may use a variety of calculations adaptive to several conditions to generate the estimated phase for each transition. Phase estimator 87 may also estimate the phase associated with each transition using Equations (12) and (13), as described above.

Phase estimator 87 supplies the generated estimated phases to phase selector 98 within second input unit 97. Phase selector 98 also receives selected transition 96 from ACS unit 94. In response to selected transition 96, phase selector 98 selects an estimated phase 99.

Phase selector 98 supplies selected estimated phase 99 to phase buffer 84. Phase buffer 84 receives and stores the M most recent values of selected estimated phase 99, where M is a positive integer. The larger the value of M, the more any noise in the input data signal will be compressed. However, the larger the value of M, the slower the response of decoder 160 and RI detector 140 to a RI type change. Phase buffer 84 sends the M most recent values of selected estimated phase 99 to phase adder 127. Phase adder 127 calculates a moving sum ph_sum[n] 128 of the M most recent values of selected estimated phase 99 from the phase buffer 84.

Concurrently, threshold table 142 receives selected transition 96 from ACS unit 94. Threshold table 142 contains transition-based threshold values for all possible transition. The transition-based threshold value for each transition is one half of the average value of the absolute values of the ideal RI phases for that transition under both negative and positive RI. Threshold table 142 may hold different values for the transition-based threshold under a PR4 target and under a MFPR4 target. Threshold buffer 143 within transition-based threshold unit 141 receives and stores the M most recent transition-based threshold values corresponding to selected transitions 96 from threshold table 142. The M most recent transition-based threshold values corresponding to selected transitions 96 are sent to threshold adder 144. Threshold adder 144 calculates a moving sum Thr_sum[n] 145 of the M most recent transition-based threshold values corresponding to selected transitions 96.

Decision unit 151 is coupled to phase adder 127 and threshold adder 144 and receives ph_sum[n] 128 and Thr_sum[n] 145. Decision unit 151 compares ph_sum[n] 128 against −Thr_sum[n] 145 and +Thr_sum[n] 145 to determine whether there exists positive RI, negative RI, or no RI. Based on the comparison, decision unit 151 generates RI flag 101, which indicates positive RI, negative RI, or no RI. Decision unit 151 supplies RI flag 101 to branch metric selector 92. Object 102 between decision unit 151 and branch metric selector 92 is merely illustrative of the overall pipeline latency N with respect to the input data signal at input terminal 90.

Figure 11:
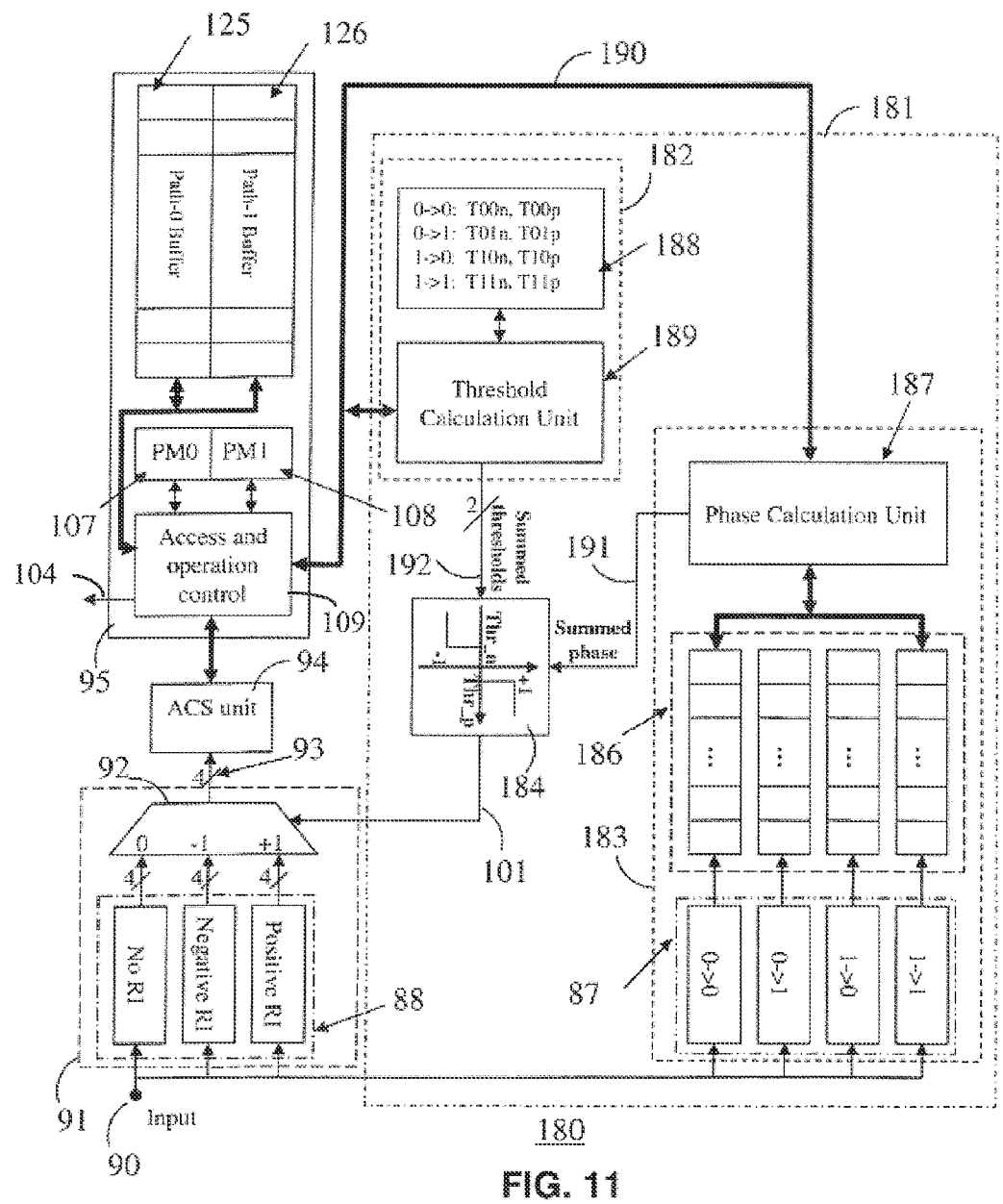
FIG. 11 is a block diagram of a decoder with RI detector and path-based unit consistent with certain aspects related to the present invention.

FIG. 11 is a block diagram of a decoder 180 different from decoders 85, 80, 135, and 160. Decoder 180 includes a RI detector 181 having a path-based threshold unit 182 consistent with certain aspects related to the present invention and does not include filter 105 of decoder 80 (FIG. 8), adaptive threshold unit 131 of decoder 135 (FIG. 9), or transition-based threshold unit 141 of decoder 160 (FIG. 10). Decoder 180 may be a two-state or four-state Viterbi or maximum-likelihood decoder and may comprise input unit 91, ACS unit 94, output unit 95, and RI detector 181. Input unit 91 may further comprise a branch metric unit 88 and a branch metric selector 92. In addition, RI detector 181 may further comprise a path-based input unit 183, a path-based threshold unit 182, and a decision unit 184 different from decision units 100, 133, and 151. Path-based input unit 183 may further comprise phase estimator 87, a path-based phase buffer 186, and a phase calculation unit 187. Path-based threshold unit 182 may further comprise a threshold table 188 different from threshold table 142 and a threshold calculation unit 189. It will be understood by one of skill in the art that decoder 180 may provide for more than two or four states.

Decoder 180 receives an input data stream conditioned in accordance with a PR4 or MFPR4 target, as previously described, at an input terminal 90. In decoding the input data stream, decoder 180 may employ trellis diagrams, as shown in FIGS. 5A, 5B, 6A-6E, and 7A-7F, to determine a bit sequence most likely to have been recorded on the storage medium out of all possible bit sequences that may have been recorded.

Referring again to FIG. 11, input terminal 90 supplies an input data signal originating from read/write head 39 (FIG. 2) to input unit 91 and path-based input unit 183. From the input data stream, branch metric unit 88 within input unit 91 identifies all possible transition in the input data stream (i.e., all transitions in the applicable trellis diagrams) and calculates a branch metric value for each. The branch metric for each branch represents the probability or likelihood that that branch is the most likely transition in the input data stream. Branch metric unit 88 may use a set of well-known predetermined and preprogrammed calculations or it may use a variety of calculations adaptive to several conditions to determine each branch metric. For instance, branch metric values may be calculated using Euclidean-based branch metric equations, Manhattan-based branch metric equations, or Hamming-based branch metric equations. Branch metric unit 88 may also use a set of three different trellis diagrams or three different sets of calculations to calculate branch metric values for transitions not influenced by RI, transitions influenced by positive RI, and transitions influenced by negative RI, as described above in connection with Equations (6)-(11).

Branch metric unit 88 supplies a set of branch metrics for each identified transition, influenced by positive RI, negative RI, and no RI to branch metric selector 92 within input unit 91. Branch metric selector 92 is coupled to branch metric unit 88 and decision unit 184 within RI detector 181. From decision unit 184, branch metric selector 92 receives RI flag 101. Based on whether RI flag 101 indicates positive RI, negative RI, or no RI, branch metric selector 92 selects a corresponding subset of transitions 93 from the transitions identified by branch metric unit 88.

Branch metric selector 92 is coupled to ACS unit 94 and supplies subset of transitions 93 to ACS unit 94, which determines possible surviving paths from the transitions in subset of transitions 93. The possible surviving paths evolve from previously determined surviving paths. The path metric value for each possible surviving path is calculated using the branch metric of each transition in subset of transitions 93 and the path metric values of previously determined surviving paths, where the path metric values for the previously determined surviving paths are stored in PM0 107 and PM1 108 in output unit 95. Comparing the path metric values for each possible surviving path merging at a same state, ACS unit 94 determines a surviving path associated with each trellis state. The path metric for the surviving paths are stored in PM0 107 and PM1 108 in output unit 95. This is equivalent to extending each previously determined surviving path by adding one new branch to it, where the newly added branches are selected from subset of transitions 93. ACS unit 94 then compares the path metrics for the surviving paths to determine a best surviving path. ACS unit 94 selects a most recent transition in the best surviving path, a selected transition 96, which is one of the newly added branches. Selected transition 96 is supplied to output unit 95.

ACS unit 94 is coupled to output unit 95 and supplies the path metric value for the surviving path associated with each trellis state, the newly added branches, the best surviving path, and selected transition 96 to output unit 95. PM0 107 in output unit 95 stores the path metric value for the surviving path associated with state 0. PM1 108 in output unit 95 stores the path metric value for the surviving path associated with state 1. Access and operation control unit (control unit) 109 may extend the previously determined surviving paths stored in path buffers 125 and 126 by first shuffling them based on the path metric value for the surviving path associated with each trellis state and then adding, at the end of the previously determined surviving paths, the newly determined branches. Control unit 109 keeps track of the best surviving path.

Output unit 95 may also compare a plurality of subset of transitions 93 and a plurality of selected transitions 96, the best surviving path, to generate a decoded data signal 104. For instance, using the best surviving path and its path metric value, output unit 95 may follow every transition in the best surviving path from a current time backwards to a fixed trace depth to determine the correctness of the best surviving path calculated by ACS unit 94. Output unit 95 then constructs a corrected best surviving path from which it outputs a decoded data signal 104. Output unit 95 is coupled to threshold calculation unit 189 within path-based threshold unit 182 and phase calculation unit 187 within path-based input unit 183 via link 190. Output unit 95 may send best surviving path information to threshold calculation unit 182 and phase calculation unit 187 via link 190.

Input terminal 90 also supplies path-based input unit 183, within RI detector 181, with the input data stream. Phase estimator 87 within path-based input unit 183 generates an estimated phase from the input data stream for each possible transition within the input data stream. For example, given the two states 0 and 1, phase estimator 87 generates phase estimates for the following four transitions: 0→0; 0→1; 1→0; and 1→1. Like branch metric unit 88, phase estimator 87 may use a set of well-known predetermined and preprogrammed calculations or it may use a variety of calculations adaptive to several conditions to generate the estimated phase for each transition. Phase estimator 87 may also estimate the phase associated with each transition using Equations (12) and (13), as described above.

The phase estimates generated by phase estimator 87 are sent to path-based phase buffer 186. Path-based phase buffer 186 may include a dedicated phase buffer for each transition, 0→0, 0→1, 1→0, and 1→1. These dedicated phase buffers hold the most recent phase estimates generated by phase estimator 87 for each transition and may be first-in-first-out (FIFO) buffers. After the phase estimates generated by phase estimator 87 are sent to path-based phase buffer 186, phase calculation unit 187 accesses output unit 95 via link 190 to retrieve information on a plurality of transitions in the best surviving path. Using the information on the plurality of transitions in the best surviving path, phase calculation unit 187 selects a corresponding estimated phase for each transition in the plurality of transitions from the path-based phase buffer 186 and adds them together. The result, a moving sum summed phase 191, is sent to decision unit 184.

Concurrently, path-based threshold unit 182 also receives information on a plurality of transitions in the best surviving path. Path-based threshold unit 182 includes threshold table 188 which contains transition-based threshold values for all possible transitions with positive RI and negative RI. Accordingly, each transition has a transition-based threshold value associated with positive RI and a transition-based threshold value associated with negative RI. The transition-based threshold value for each transition is one half of the theoretical RI phase for that transition under either positive or negative RI. Threshold table 188 may hold different values for the transition-based threshold under a PR4 target and under a MFPR4 target. Alternatively, the transition-based threshold value may be calculated not just using a n-th user bit and a (n−1)-th user bit (i.e., one transition), but may be calculated using the n-th user bit, the (n−1)-th user bit, and a (n−2)-th user bit or a (n+1)-th user bit. Threshold table 188 is coupled to threshold calculation unit 189 to which it sends the transition-based threshold values corresponding to the plurality of transitions in the best surviving path.

Threshold calculation unit 189 is coupled between path-based threshold table 188 and decision unit 184 and receives transition-based threshold values corresponding to the plurality of transitions in the best surviving path. Threshold calculation unit 189 separately sums the transition-based threshold values associated with positive RI and the transition-based threshold values associated with negative RI to generate two moving sum summed thresholds 192 that it sends to decision unit 184.

Decision unit 184 is coupled to threshold calculation unit 189, phase calculation unit 187, and branch metric selector 92 within input unit 91. Decision unit 184 receives summed thresholds 192 from threshold calculation unit 189 and summed phase 191 from phase calculation unit 187. It compares summed phase 191 against summed thresholds 192 to determine whether there exists positive RI, negative RI, or no RI. Based on the comparison, decision unit 184 generates RI flag 101, which indicates positive RI, negative RI, or no RI. Decision unit 184 supplies RI flag 101 to branch metric selector 92 within input unit 91. There may exist an overall pipeline latency between RI flag 101 and the input data signal at input terminal 90.

Figure 12A:
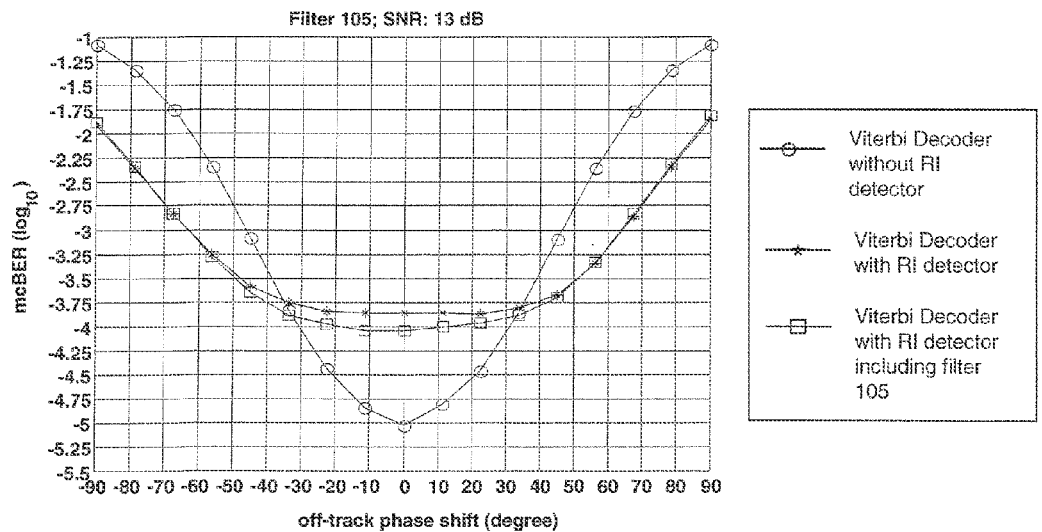
FIGS. 12A-S illustrate the BER as a function of off-track phase shift for decoders with RI detectors consistent with certain aspects related to the present invention at various signal to noise ratios.
Figure 12B:
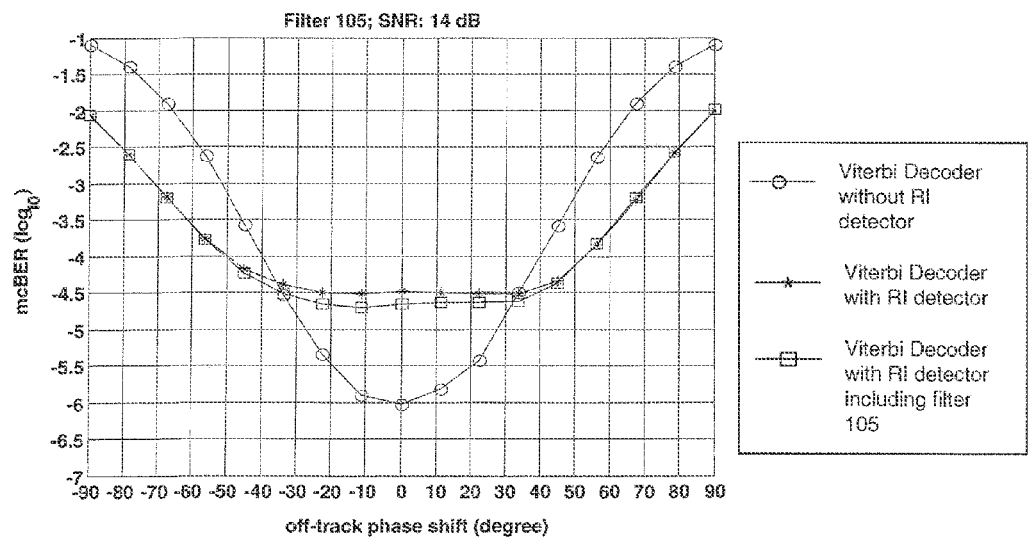
Figure 12C:
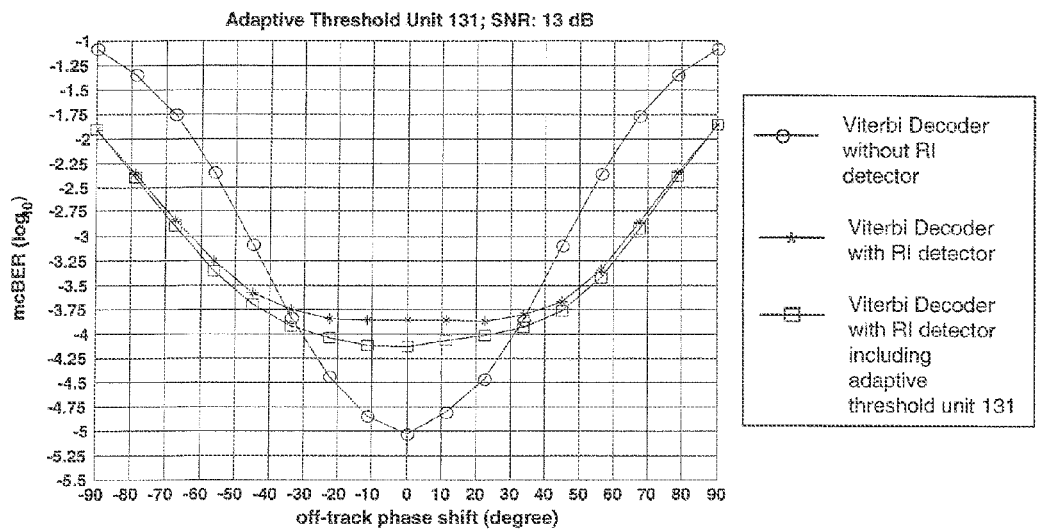
Figure 12D:
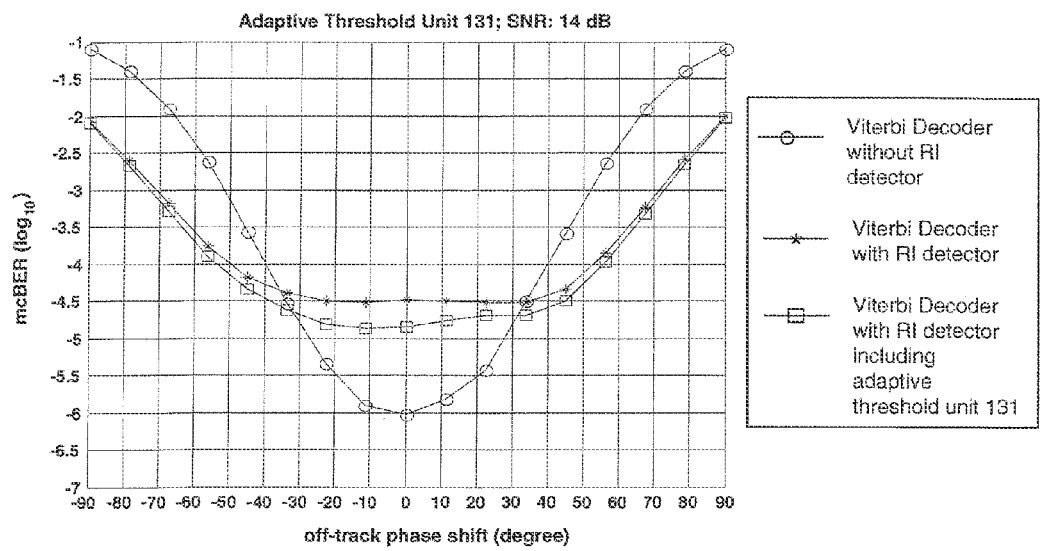
Figure 12E:
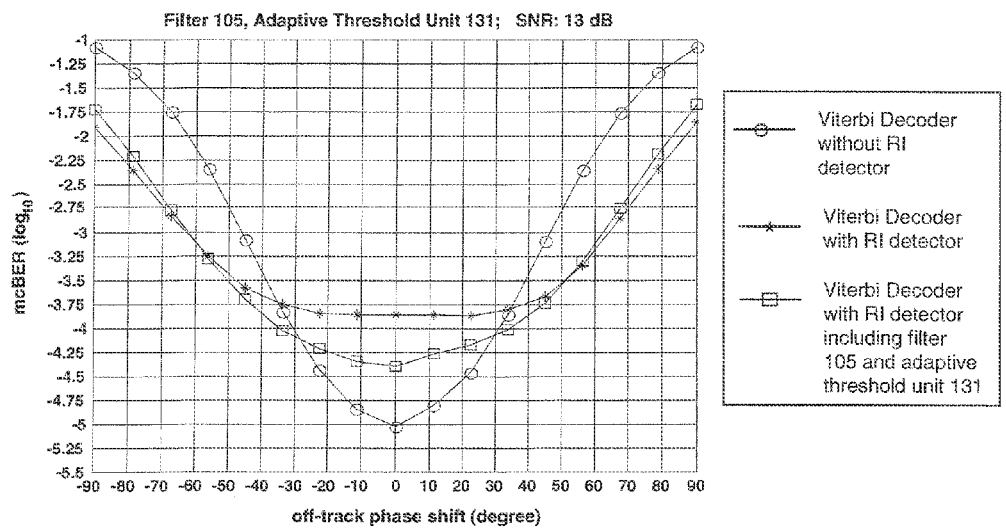
Figure 12F:
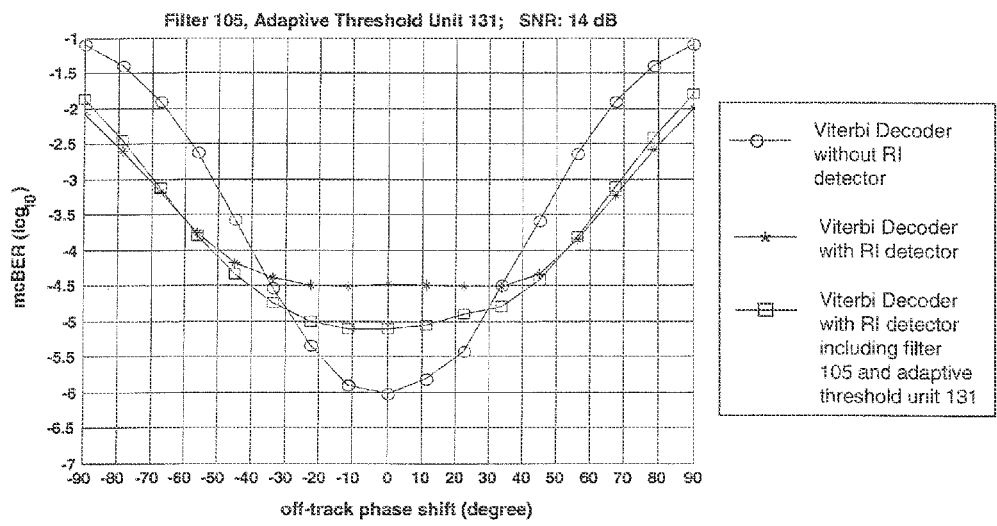
Figure 12G:
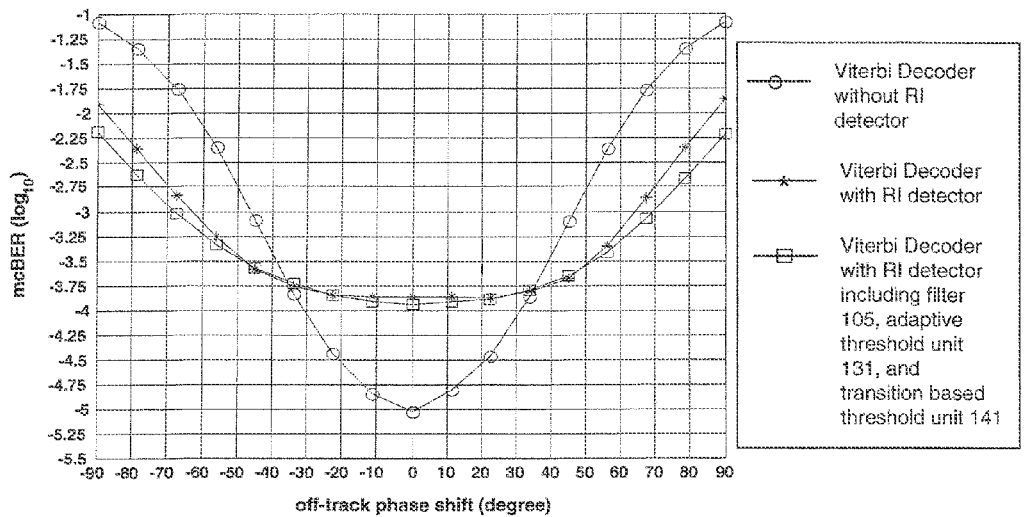
Figure 12H:
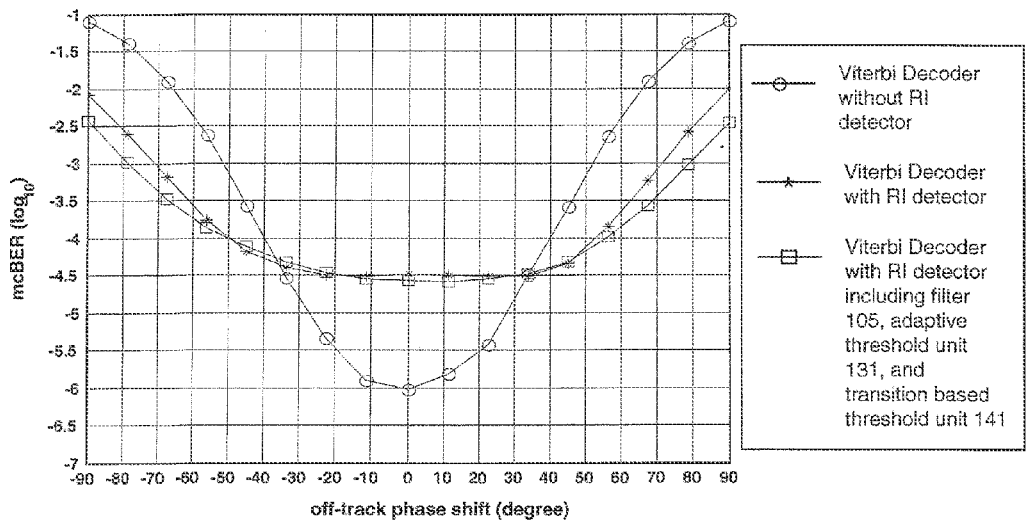
Figure 12I:
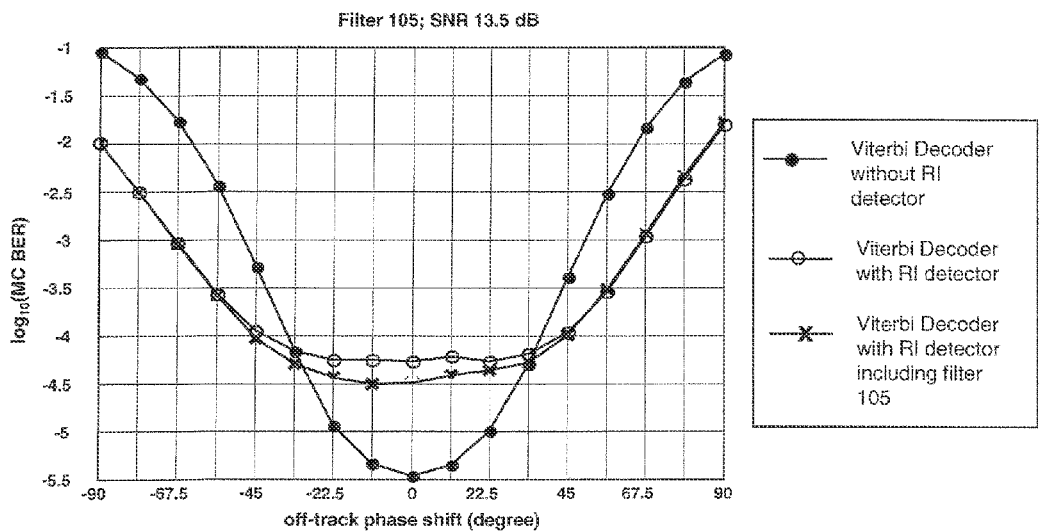
Figure 12J:
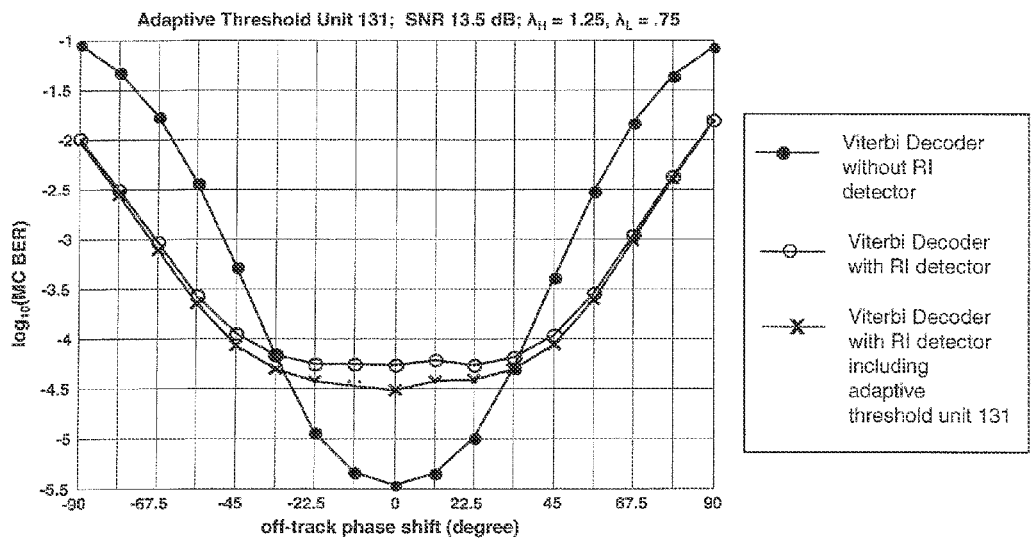
Figure 12K:
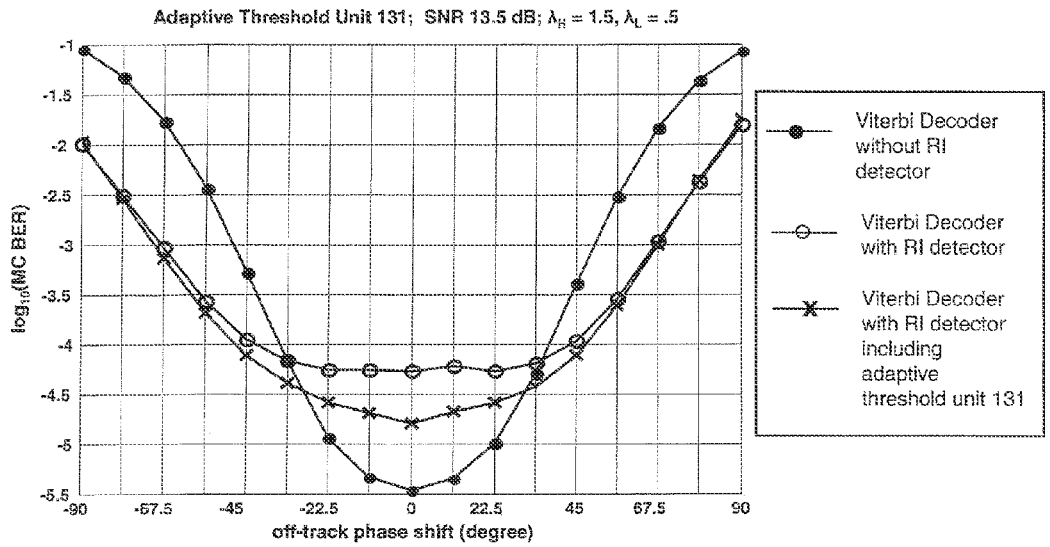
Figure 12L:
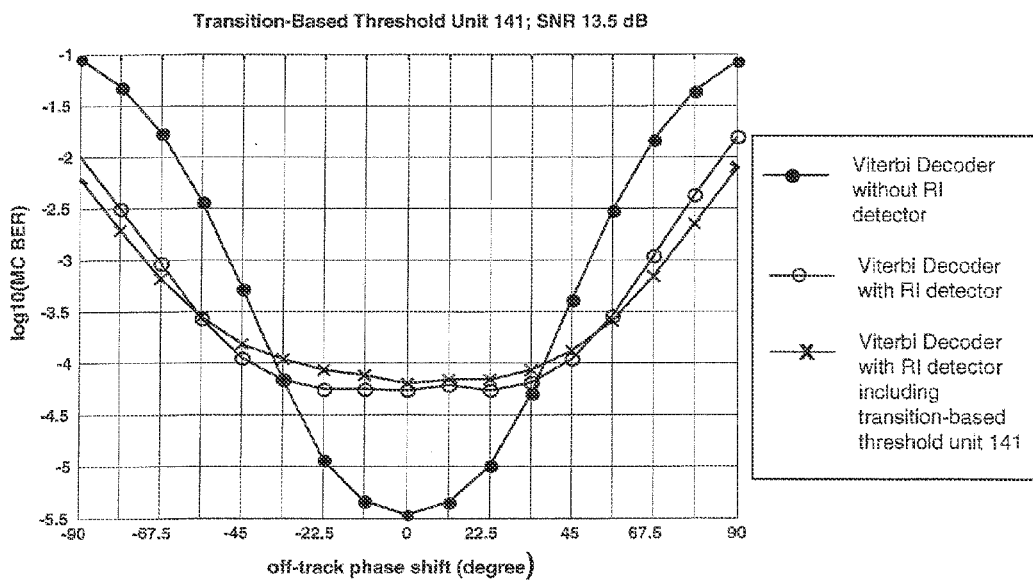
Figure 12M:
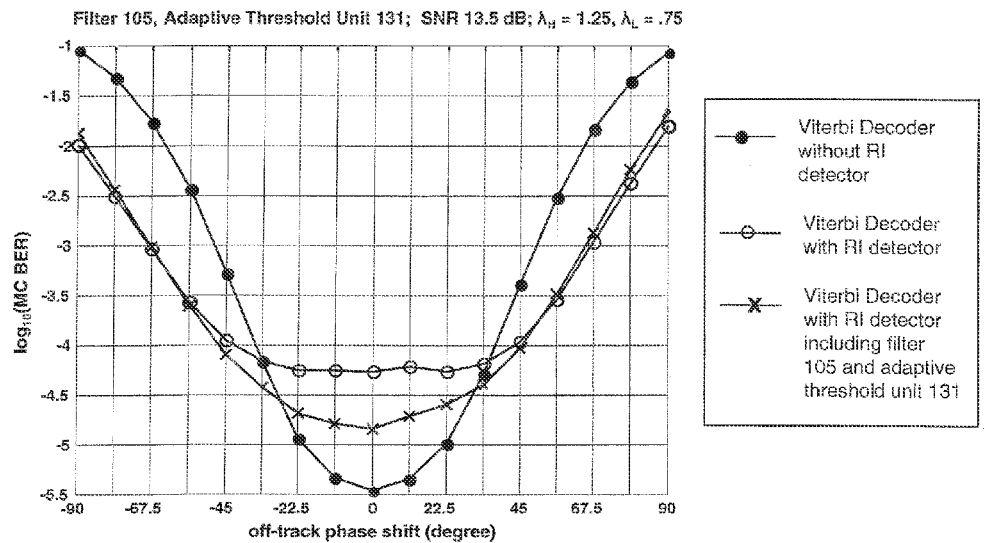
Figure 12N:
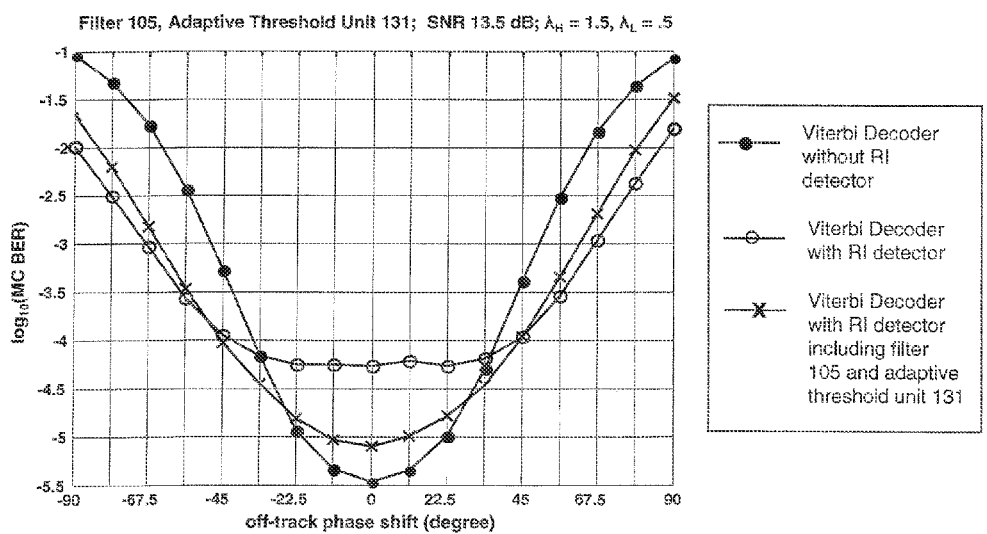
Figure 12O:
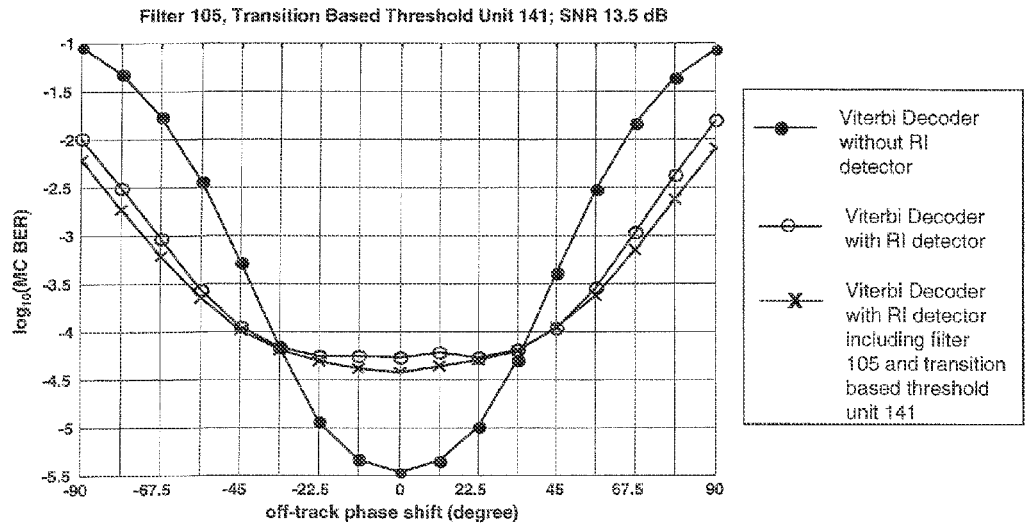
Figure 12P:
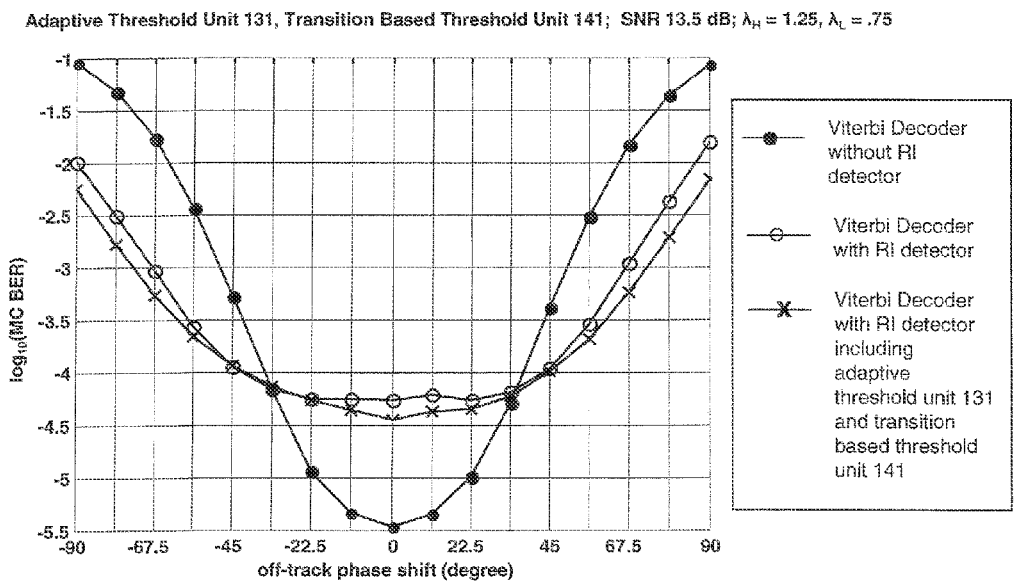
Figure 12Q:
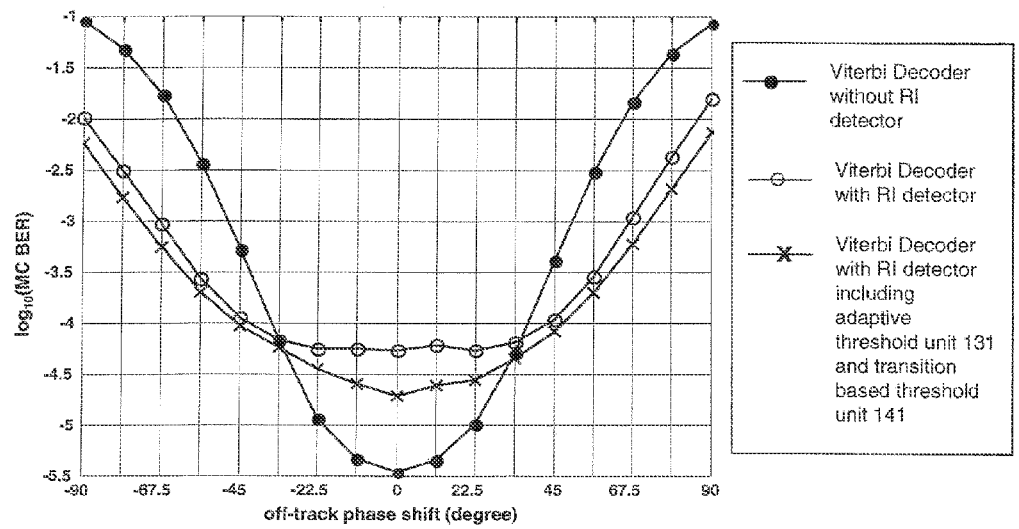
Figure 12R:
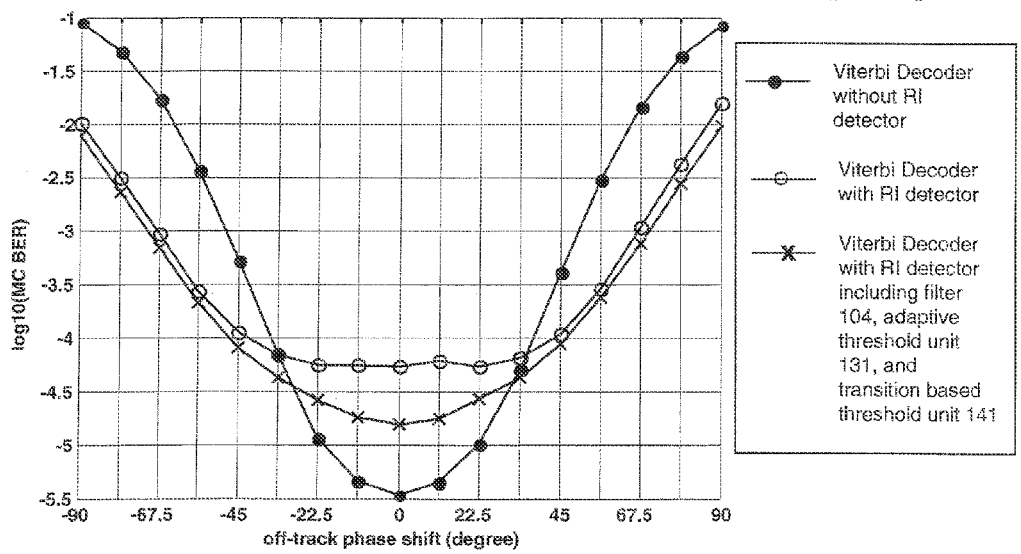
Figure 12S:
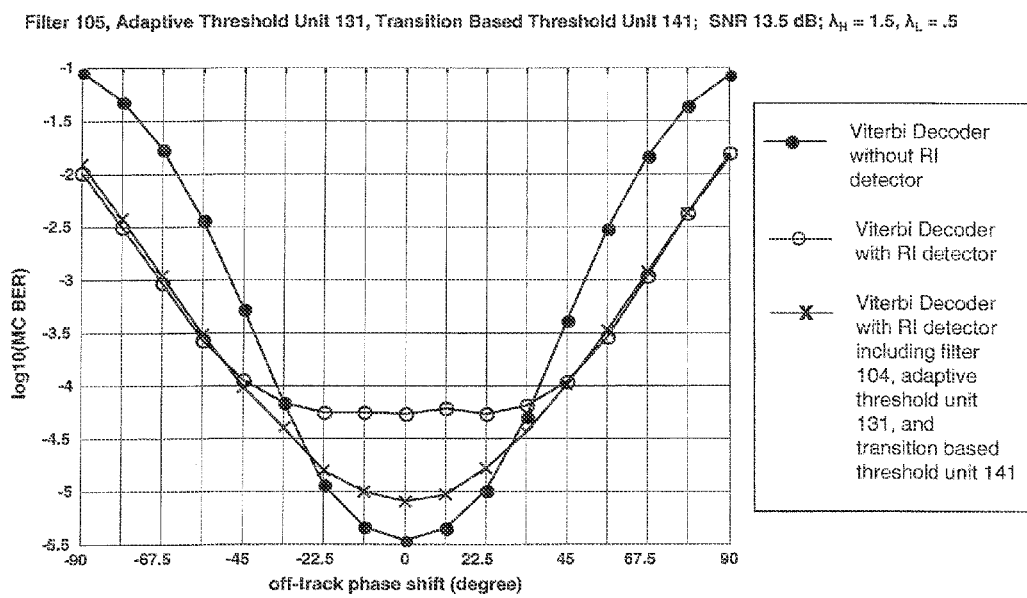

It will be understood by one skilled in the art that filter 105, adaptive threshold unit 131, transition-based threshold unit 141, and path-based threshold unit 182 with path-based input unit 183 may be used separately or in combination. For example, filter 105 may be used alone, with adaptive threshold unit 131, with transition-based threshold unit 141, with path-based threshold unit 182 with path-based input unit 183, or with both adaptive threshold unit 131 and transition-based threshold unit 141. Other combinations are possible, for specific applications. FIGS. 12A-S illustrate the BER as a function of the off-track phase shift with respect to the on-track signal in degrees at various signal-to-noise ratios (SNR) for a Viterbi decoder without an RI detector, a Viterbi decoder with an RI detector and a Viterbi decoder using filter 105, adaptive threshold unit 131, and transition-based threshold unit 141 either alone or in combination.

The systems and methods disclosed herein are not inherently related to any particular computer or other apparatus, and may be implemented by a suitable combination of hardware, software, and/or firmware. Software implementations may include one or more computer programs. A computer program is a set of instructions readable and executable by a processor and can be written in any form of programming language, including compiled or interpreted languages, and it can be deployed in any form, including as a stand alone program or as a module, component, subroutine, or other unit suitable for use in a computing environment. A computer program can be deployed to be executed on one computer or on multiple computers at one site or distributed across multiple sites and interconnected by a communication network. Software may also be implemented as a computer program product, i.e., one or more computer programs tangibly embodied in an information carrier, e.g., in a machine readable storage device or in a propagated signal, for execution by, or to control the operation of, data processing apparatus, e.g., a programmable processor, a computer, or multiple computers.

The foregoing description is intended to illustrate but not to limit the scope of the invention, which is defined by the scope of the appended claims. Other embodiments are within the scope of the following claims.

What is claimed is:

1. A system for decoding data stored on a data storage medium, the system comprising:
    a first input unit operative to identify portions of a received data stream as possible transitions;
    a second input unit operative to generate estimated phases of the possible transitions;
    a decision unit operative to generate a flag based on the estimated phases and an adjusted adaptive threshold value, wherein the flag indicates a type of radial incoherence associated with the data stream and the adjusted adaptive threshold value is generated by an adaptive threshold unit.

2. The system of claim 1 further comprising an adder operative to generate a sum by adding a plurality of selected estimated phases, wherein:
    the second input unit is further operative to select the selected estimated phases, and
    the decision unit is further operative to generate the flag using the sum.

3. The system of claim 2, wherein the sum is a first sum, further comprising:
    an add-compare-select unit operative to select a transition from a subset of the possible transitions; and
    a transition-based threshold unit operative to:
        store a plurality of transition-based threshold values;
        receive the selected transition from the add-compare-select unit;
        select one of the plurality of transition-based threshold values in response to the selected transition;
        generate a second sum by adding a plurality of the selected transition-based threshold values; and
        supply the second sum to the decision unit.

4. The system of claim 3 wherein the decision unit further compares the first sum with the second sum to generate the flag.

5. The system of claim 1 wherein the adaptive threshold unit is further operative to:
    store an adaptive threshold value;
    receive the flag from the decision unit;
    compare the flag with the adaptive threshold value;
    generate the adjusted adaptive threshold value by adjusting the adaptive threshold value based upon the comparison; and
    store the adjusted adaptive threshold value as the adaptive threshold value.

6. The system of claim 5 wherein the decision unit is further operative to compare the first sum with the adjusted adaptive threshold value to generate the flag.

7. The system of claim 5 wherein generating the adjusted adaptive threshold value comprises:
    increasing the adaptive threshold value when the flag indicates no radial incoherence; and
    decreasing the adaptive threshold value when the flag indicates negative or positive radial incoherence.

8. The system of claim 1 further comprising a filter operative to:
    receive a plurality of flags from the decision unit;
    store the plurality of flags;
    compare the plurality of flags;
    generate a radial incoherence-type signal based upon the comparison; and
    supply the radial incoherence-type signal to the first input unit as a selection input.

9. A method for decoding data stored on a data storage medium, the method comprising:
    identifying, with a first input unit, portions of a received data stream as possible transitions;
    generating, with a second input unit, estimated phases of the possible transitions;
    generating, with a decision unit, a flag based on the estimated phases and an adjusted adaptive threshold value, wherein the flag indicates a type of radial incoherence associated with the data stream and the adjusted adaptive threshold value is generated by an adaptive threshold unit.

10. The method of claim 9 further comprising:
    generating, with an adder, a sum by adding a plurality of selected estimated phases, and wherein the decision unit generates the flag using the sum.

11. The method of claim 10, wherein the sum is a first sum, further comprising:
    selecting, with an add-compare-select unit, a transition from a subset of the possible transitions; and
    storing, in a transition-based threshold unit, a plurality of transition-based threshold values;
    receiving, at the transition-based threshold unit, the selected transition from the add-compare-select unit;
    selecting, at the transition-based threshold unit, one of the plurality of transition-based threshold values in response to the selected transition;
    generating, at the transition-based threshold unit, a second sum by adding a plurality of the selected transition-based threshold values; and
    supplying the second sum to the decision unit.

12. The method of claim 11 further comprising comparing, using the decision unit, the first sum with the second sum to generate the flag.

13. The method of claim 9 wherein generating, with the adaptive threshold unit, an adjusted adaptive threshold value further comprises:
    storing, in the adaptive threshold unit, an adaptive threshold value;
    comparing the flag received from the decision unit with the adaptive threshold value;
    generating the adjusted adaptive threshold value by adjusting the adaptive threshold value based upon the comparison; and
    storing the adjusted adaptive threshold value as the adaptive threshold value.

14. The method of claim 11 wherein generating the flag using the decision unit further comprises comparing the first sum with the adjusted adaptive threshold value.

15. The method of claim 13 wherein generating the adjusted adaptive threshold value comprises:
increasing the adaptive threshold value when the flag indicates no radial incoherence; and
decreasing the adaptive threshold value when the flag indicates negative or positive radial incoherence.

16. The method of claim 9 further comprising:
receiving the flag from the decision unit;
storing a plurality of the flags;
comparing the plurality of the flags;
generating a radial incoherence-type signal based upon the comparison; and
supplying the radial incoherence-type signal to the first input unit as a selection input.

17. A system for decoding data stored on a data storage medium, the system comprising:
a path-based input unit operative to generate a first sum;
a path-based threshold unit operative to generate a second sum;
a decision unit operative to use the first sum and the second sum to generate a flag, wherein the flag indicates a type of radial incoherence associated with the data; and
an adaptive threshold unit operative to:
generate an adjusted adaptive threshold value, and
supply the adjusted value to the decision unit.

18. The system of claim 17 further comprising:
an add-compare-select unit operative to select a transition from a subset of possible transitions in a received data stream;
an output unit operative to generate a decoded data signal as an output signal; and
the path-based input unit, wherein the path-based input unit is further operative to:
generate estimated phases of the possible transitions;
store the estimated phases in a phase buffer;
receive a plurality of selected transitions from the output unit;
select the estimated phases that correspond to the plurality of selected transitions;
generate the first sum by adding the estimated phases that correspond to the plurality of selected transitions; and
supply the first sum to the decision unit.

19. The system of claim 18 wherein the path-based threshold unit is further operative to:
store a plurality of path-based threshold values;
receive the plurality of selected transitions from the output unit;
select the path-based threshold values that correspond to the plurality of selected transitions;
generate the second sum by adding the selected path-based threshold values; and
supply the second sum to the decision unit.

20. The system of claim 17 wherein the adaptive threshold unit is further operative to:
store the adaptive threshold value;
receive the flag from the decision unit;
compare the flag with the adaptive threshold value;
generate the adjusted adaptive threshold value by adjusting the adaptive threshold value based upon the comparison;
supply the adjusted adaptive threshold value to the decision unit; and
store the adjusted adaptive threshold value as the adaptive threshold value.

* * * * *